US009337876B2

(12) United States Patent
Seo

(10) Patent No.: US 9,337,876 B2
(45) Date of Patent: May 10, 2016

(54) DIGITAL WIRELESS TRANSMITTER HAVING PARALLEL STRUCTURE AND WIRELESS COMMUNICATION SYSTEM INCLUDING THE SAME

(71) Applicant: SAMSUNG ELECTRONICS CO., LTD., Suwon-si, Gyeonggi-do (KR)

(72) Inventor: Sang-Ho Seo, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 31 days.

(21) Appl. No.: 14/257,518

(22) Filed: Apr. 21, 2014

(65) Prior Publication Data

US 2014/0314178 A1 Oct. 23, 2014

(30) Foreign Application Priority Data

Apr. 22, 2013 (KR) ........................ 10-2013-0044360

(51) Int. Cl.
| | |
|---|---|
| H04L 27/00 | (2006.01) |
| H04B 1/04 | (2006.01) |
| H03M 3/00 | (2006.01) |
| H03M 9/00 | (2006.01) |
| H03M 7/30 | (2006.01) |

(52) U.S. Cl.
CPC .............. *H04B 1/0475* (2013.01); *H03M 3/30* (2013.01); *H03M 7/3004* (2013.01); *H03M 9/00* (2013.01); *H03M 3/508* (2013.01); *H04B 2001/0408* (2013.01)

(58) Field of Classification Search
USPC ................................................ 375/295–315
See application file for complete search history.

(56) References Cited

U.S. PATENT DOCUMENTS

| | | | |
|---|---|---|---|
| 6,876,698 B1* | 4/2005 | Dick et al. ................. 375/229 |
| 2001/0050962 A1* | 12/2001 | Adachi et al. ............. 375/264 |
| 2002/0027518 A1* | 3/2002 | Pinna ........................ 341/144 |
| 2006/0183440 A1* | 8/2006 | Morris et al. ............. 455/103 |

(Continued)

FOREIGN PATENT DOCUMENTS

| | | |
|---|---|---|
| EP | 2134053 | 12/2009 |
| JP | 2008509575 | 3/2008 |

(Continued)

OTHER PUBLICATIONS

Yijun Zhou et al., "A 10-Bit Wide-Band CMOS Direct Digital RF Amplitude Modulator", IEEE Journal of Solid-State Circuits, vol. 38, No. 7, Jul. 2003. pp. 1182-1188.

(Continued)

*Primary Examiner* — Dac Ha
*Assistant Examiner* — Janice Tieu
(74) *Attorney, Agent, or Firm* — F. Chau & Associates, LLC

(57) ABSTRACT

A digital wireless transmitter is provided. The digital wireless transmitter includes a serial-to-parallel converter, a delta-sigma modulator (DSM), and a radio frequency (RF) converter. The serial-to-parallel converter is configured to interpolate a serial digital input signal and to output N parallel signals, where N is a positive integer greater than one. The DSM is configured to perform delta-sigma modulation on the N parallel signals in parallel. The RF converter is configured to arrange N delta-sigma modulated signals into K parallel signals, to delay the K parallel signals by different delay times, and to convert delayed signals into an RF signal, where K is a positive integer greater than N.

20 Claims, 19 Drawing Sheets

(56) References Cited

U.S. PATENT DOCUMENTS

| | | | |
|---|---|---|---|
| 2006/0269011 A1* | 11/2006 | Stewart | 375/269 |
| 2009/0082006 A1* | 3/2009 | Pozsgay et al. | 455/422.1 |
| 2010/0027711 A1 | 2/2010 | Manku et al. | |

FOREIGN PATENT DOCUMENTS

| | | |
|---|---|---|
| KR | 1020080087465 | 10/2008 |
| KR | 1020090031656 | 3/2009 |
| KR | 1020090034155 | 4/2009 |
| KR | 1020110070675 | 6/2011 |

OTHER PUBLICATIONS

Shahin Mehdizad Taleie, et al., "A Bandpass ΔΣRF-DAC with Embedded FIR Reconstruction Filter", ISSCC 2006/Section31/Very High-Speed ADCs and DACs/31.7.

Robert Bogdan Staszewski, et al., "All-Digital PLL and GSM/EDGE Transmitter in 90nm CMOS", ISSCC 2005/Session 17/RF Cellular ICs/17.5.

Jae Ho Jung et al., "Implementation of Reconfigurable Transceiver based on Digital IF for Multiple Wideband CDMA Signals", IEEE, 2003, pp. 2842-2846.

Sung-Rok Yoon, et al., "All-Digital Transmitter Architecture based on Bandpass Delta-Sigma Modulator", ISCIT 2009, pp. 703-706.

Jennifer Pham, "Time-interleaved ΔΣ-DAC for Broadband Wireless Applications", A thesis submitted in conformity with the requirements for the degree of Master of Applied Science Graduate Department of Electrical and Computer Engineering, University of Toronto, 2007, pp. 1-146.

Mohamed Helaoui, et al., "A Novel Architecture of Delta-Sigma Modulator Enabling All-Digital Multiband Multistandard RF transmitters Design", IEEE Transactions on Circuits and Systems—II: Express Briefs, vol. 55, No. 11, Nov. 2008, pp. 1129-1133.

Petri Eloranta, et al., "A Multimode Transmitter in 0.13 μm CMOS Using Direct-Digital RF Modulator", IEEE Journal of Solid-State Circuits, vol. 42, No. 12, Dec. 2007, pp. 2774-2784.

Ian Galton, et al., "Delta-Sigma Modulator Based A/D Conversion without Oversampling", IEEE Transactions on Circuits and Systems—II: Analog and Digital Signal Processing, vol. 42, No. 12, Dec. 1995, pp. 773-784.

Aria Eshraghi, et al., "A Comparative Analysis of Parallel Delta-Sigma ADC Architectures", IEEE Transactions on Circuits and Systems—I: Regular Papers, vol. 51, No. 3, Mar. 2004, pp. 450-458.

Michael Nielsen, et al., "A Transmitter Architecture Based on Delta-Sigma Modulation and Switch-Mode Power Amplification", IEEE Transactions on Circuits and Systems—II: Express Briefs, vol. 54, No. 8, Aug. 2007, pp. 735-739.

Albert Jerng, et al., "A Wideband ΔΣDigital-RF Modulator for High Data Rate Transmitters", IEEE Journal of Solid-State Circuits, vol. 42, No. 8, Aug. 2007, pp. 1710-1722.

Andras Pozsgay, et al., "A Fully Digital 65nm CMOS Transmitter for the 2.4-2.7 GHz WiFi/ WiMAX Bands using 5.4GHz ΔΣ RF DACs", 2008 IEEE International Solid-State Circuits Conference, pp. 360-361, 619.

Jaakko Ketola, et al., "Transmitter Utilising Bandpass Delta-Sigma Modulator and Switching Mode Power Amplifier", ISCAS 2004, pp. I-633-I-636.

Antoine Frappe, et al., "A Digital ΔΣ RF Signal Generator for Mobile Communication Transmitters in 90nm CMOS", 2008 IEEE Radio Frequency Integrated Circuits Symposium, pp. 13-16.

Loke Kun Tan, et al., "A 200 MHz Quadrature Digital Synthesizer/Mixer in 0.8 μm CMOS", IEEE Journal of Solid-State Circuits, vol. 30, No. 3, Mar. 1995, pp. 193-200.

Khaled A. Shehata, et al., "An FPGA Based 1-bit All Digital Transmitter Employing Delta-Sigma Modulation with RF Output for SDR", 2008 International Conference on Signals, Circuits and Systems, pp. 1-6.

Chien-Jung Li, et al., "High Average-Efficiency Multimode RF Transmitter Using a Hybrid Quadrature Polar Modulator", IEEE Transactions on Circuits and Systems—II: Express Briefs, vol. 55, No. 3, Mar. 2008, pp. 249-253.

Petri Eloranta, et al., "Direct-Digital RF Modulator IC in 0.13 μm CMOS for Wide-Band Multi-Radio Applications", 2005 IEEE International Solid-State Circuits Conference, pp. 532-533, 615.

Viral K. Parikh, et al., "A Fully Digital Architecture for Wideband Wireless Transmitters", RWS 2008, pp. 147-150.

Paul T.M. van Zeiji, et al., "A Multi-Standard Digital Envelope Modulator for Polar Transmitters in 90nm CMOS", 2007 IEEE Radio Frequency Integrated Circuits Symposium, pp. 373-376.

Pervez M. Aziz, et al., "An Overview of Sigma-Delta Converters: How a 1-bit ADC achieves more than 16-bit resolutions", IEEE Signal Processing Magazine, vol. 13, Issue 1, Sep. 1996, pp. 61-84.

* cited by examiner

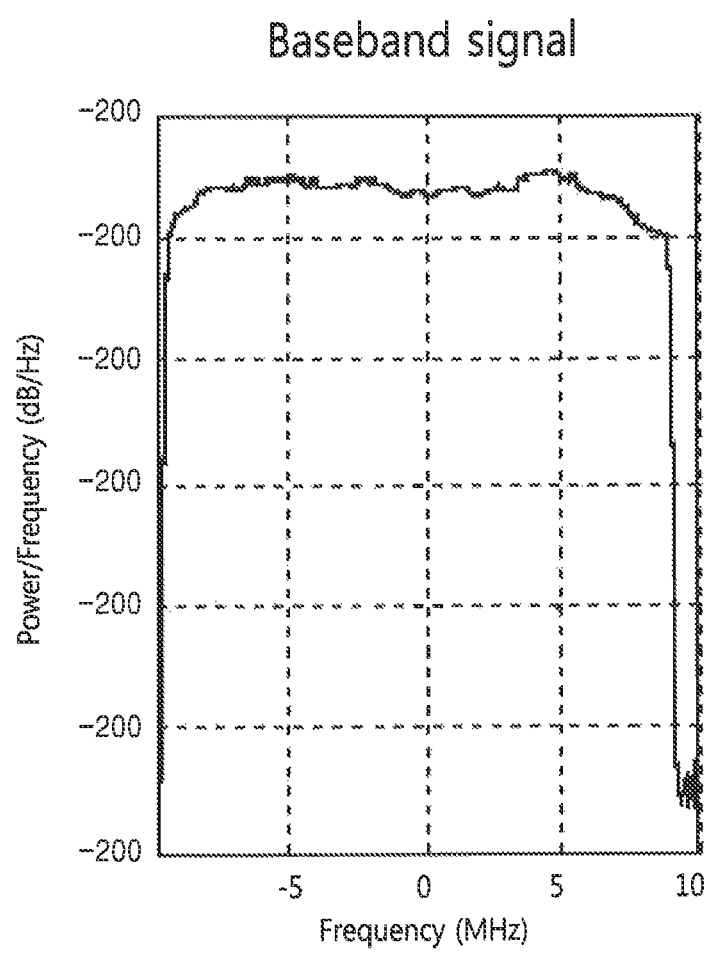

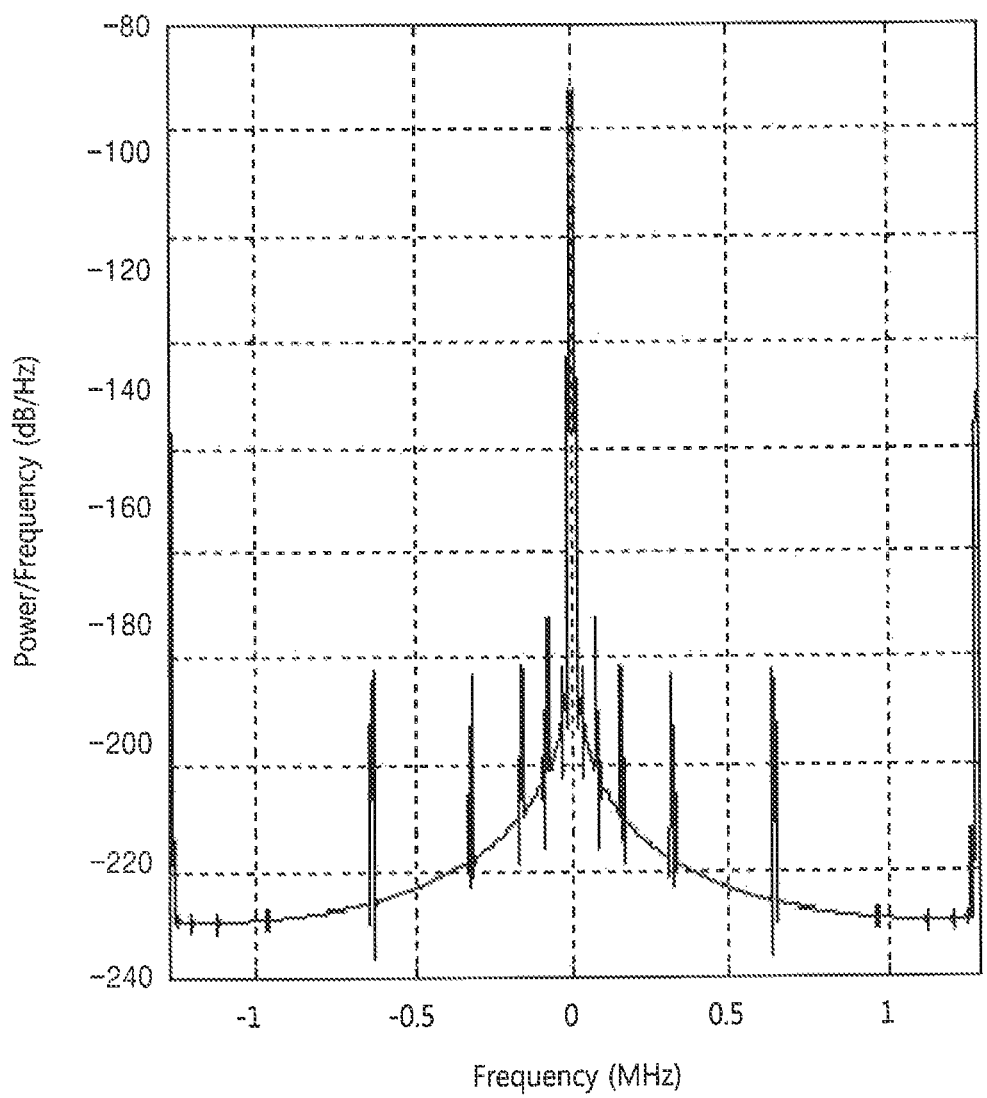

After 2nd order LP-DSM

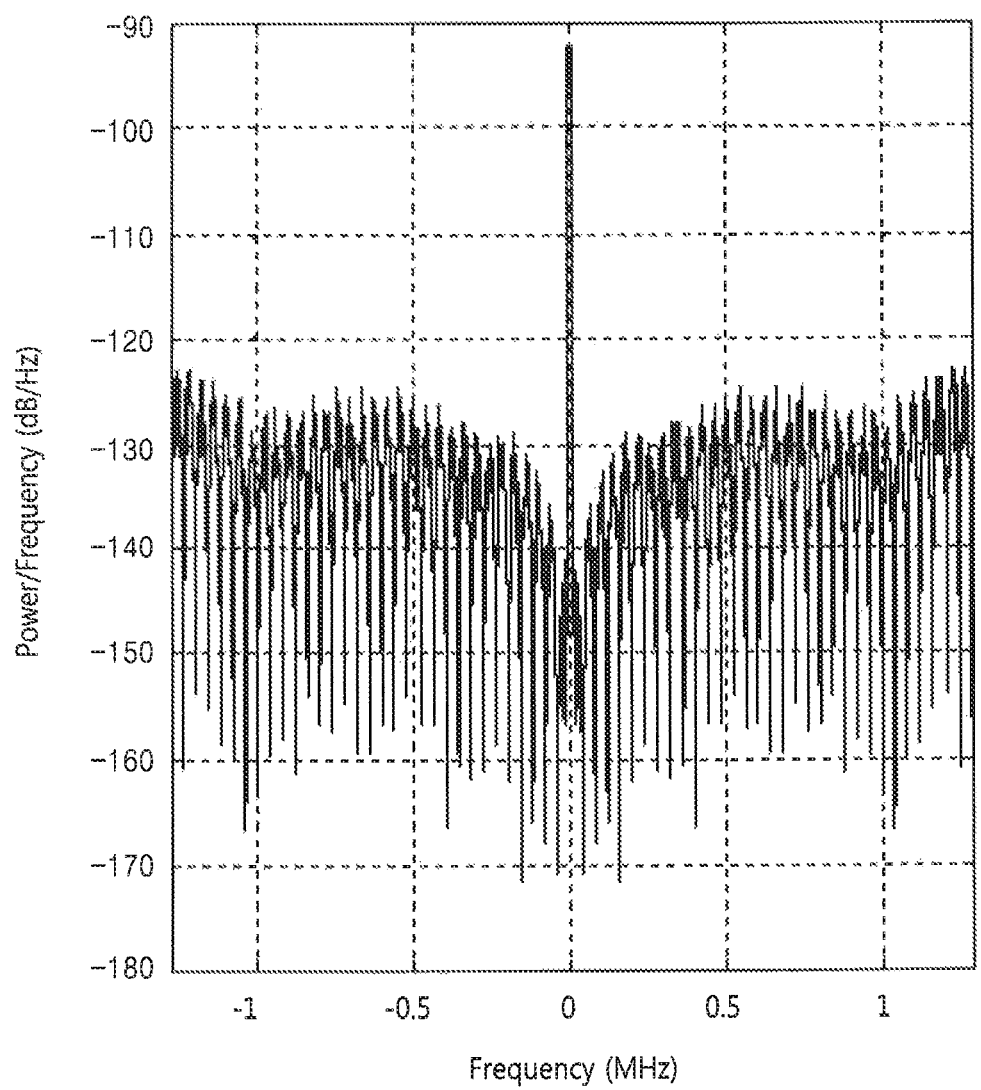

DIGITAL WIRELESS TRANSMITTER HAVING PARALLEL STRUCTURE AND WIRELESS COMMUNICATION SYSTEM INCLUDING THE SAME

CROSS-REFERENCE TO RELATED PATENT APPLICATIONS

This application claims priority under 35 U.S.C. §119(a) to Korean Patent Application No. 10-2013-0044360, filed on Apr. 22, 2013, in the Korean Intellectual Property Office, the disclosure of which is incorporated by reference herein.

TECHNICAL FIELD

Embodiments of the inventive concept relate to a signal transmitter, and more particularly, to a digital wireless transmitter or a wireless communication system including the same.

DISCUSSION OF THE RELATED ART

There have been studies on digital transmitters which may be used in a software defined radio (SDR) to remove analog or radio frequency (RF) interference.
A delta-sigma modulator (DSM) may reduce in-band quantization noise when it is used in the digital transmitters. In particular, the DSM that outputs a single-bit stream may have been considered as an ideal modulator since a power amplifier operates linearly and stably with a single-bit stream.

SUMMARY

According to an embodiment of the inventive concept, there is provided a digital wireless transmitter. The digital wireless transmitter includes a serial-to-parallel converter, a delta-sigma modulator (DSM), and a radio frequency (RF) converter. The serial-to-parallel converter is configured to interpolate a serial digital input signal and to output N parallel signals, where N is a positive integer greater than one. The delta-sigma modulator (DSM) is configured to perform delta-sigma modulation on the N parallel signals in parallel, and to output N delta-sigma modulated signals. The digital RF converter is configured to arrange N delta-sigma modulated signals into K parallel signals, to delay the K parallel signals by different delay times, and to convert the delayed signals into an RF signal, where K is a positive integer greater than N.

The serial-to-parallel converter may include a first interpolator and a second interpolator. The first interpolator may be configured to perform an L-time interpolation on the serial digital input signal, where L is a positive integer. The second interpolator may be configured to perform an M-time interpolation to the L times interpolated serial signal to output the N parallel signals, where M is a positive integer.

The DSM may include first through N-th channel DSM units, each of the first through N-th channel DSM units may be configured to perform at least one addition, at least one delay, and at least one binary quantization to a corresponding one of the N parallel signals, and to output the N delta-sigma modulated signals. Each of the first through N-th channel DSM units may be coupled to at least one of the other channel DSM units and may use a signal generated by the at least one of the other channel DSM units as an input in the at least one addition.

Each of the first through N-th channel DSM units may output a stream of single-bit signals.

Each of the first through N-th channel DSM units may be a second- or higher-order low pass DSM unit.

The first channel DSM unit among the first through N-th channel DSM units may include a first adder, a second adder, a third adder, a fourth adder, a delay unit, and a quantizer. The first adder may be configured to add a first parallel signal of the N parallel signals and an output signal of the N-th channel DSM unit. The second adder may be configured to add an output signal of the first adder and a signal obtained by delaying an output signal of a second adder of the N-th channel DSM unit. The third adder may be configured to add an output signal of the second adder and the output signal of the N-th channel DSM unit. The fourth adder may be configured to add an output signal of the third adder and a signal obtained by delaying an output signal of a fourth adder of the N-th channel DSM unit. The delay unit may be configured to delay an output signal of the fourth adder of the first channel DSM unit. The quantizer may be configured to quantize an output signal of the delay unit.

The second channel DSM unit among the first through N-th channel DSM units may include a first adder, a second adder, a third adder, a fourth adder, a delay unit, and a quantizer. The first adder may be configured to add the second parallel signal and a signal obtained by quantizing an output signal of the fourth adder of the first channel DSM unit. The second adder may be configured to add an output signal of the first adder of the second channel DSM unit and an output signal of the second adder of the first channel DSM unit. The third adder may be configured to add an output signal of the second adder of the second channel DSM unit and the signal obtained by quantizing the output signal of the fourth adder of the first channel DSM unit. The fourth adder may be configured to add an output signal of the third adder of the second channel DSM unit and the output signal of the fourth adder of the first channel DSM unit. The delay unit may be configured to delay an output signal of the fourth adder of the second channel DSM unit. The quantizer may be configured to quantize an output signal of the delay unit of the second channel DSM unit.

The RF converter may include a re-parallelization module, a delay module, and an RF converter module. The re-parallelization module may be configured to re-parallelize the N delta-sigma modulated signals into the K parallel signals. The delay module may be configured to delay the K parallel signals. The RF converter module may be configured to convert the delayed signals output from the delay module into the RF signal.

The delay module may include first through K-th delay elements and the m-th delay element among the first through K-th delay elements may be configured to delay the m-th parallel signal of the K parallel signals by (m−1) clock cycles, where "m" is a positive integer of at least one and at most K. The RF converter module may include a plurality of unit Gilbert cell circuits and each of the plurality of unit Gilbert cell circuits may convert an output signal of a corresponding one of the first through K-th delay elements into the RF signal.

Each of the plurality of unit Gilbert cell circuits may include a first transistor, a second transistor, a third transistor, a fourth transistor, a fifth transistor, and a sixth transistor. The first transmitter may have a gate connected to a first input node, a source connected to a first common source node, and a drain connected to a first output node. The second transistor may have a gate connected to a second input node, a source connected to the first common source node, and a drain connected to a second output node. The third transistor may have a gate connected to the second input node, a source connected to a second common source node, and a drain connected to the first output node. The fourth transistor may have a gate connected to the first input node, a source connected to the second common source node, and a drain connected to the second output node. The fifth transistor may be connected between the first common source node and a current source, and configured to receive a positive signal of a first oscillation signal. The sixth transistor may be connected between the second common source node and the current source, and configured to receive a negative signal of the first oscillation signal. An input signal to the first and second input nodes may be the output signal of the corresponding one of the first through K-th delay elements.

The first output nodes of the respective unit Gilbert cell circuits may be connected in common to a first input terminal of a power amplifier and the second output nodes of the respective unit Gilbert cell circuits may be connected in common to a second input terminal of the power amplifier.

According to an embodiment of the inventive concept, there is provided a digital wireless transmitter. The digital wireless transmitter includes a first serial-to-parallel converter, a second serial-to-parallel converter, a first DSM, a second DSM, a first RF converter, and a second RF converter. The first serial-to-parallel converter may be configured to interpolate a serial in-phase digital input signal and to output N in-phase parallel signals, where N is a positive integer greater than one. The second serial-to-parallel converter may be configured to interpolate a serial quadrature-phase digital input signal and to output N quadrature-phase parallel signals. The first DSM may be configured to perform delta-sigma modulation on the N in-phase parallel signals in parallel. The second DSM may be configured to perform delta-sigma modulation on the N quadrature-phase parallel signals in parallel. The first digital RF converter may be configured to convert the N in-phase DSM signals output from the first DSM into an in-phase RF signal using a first oscillation signal. The second digital RF converter may be configured to convert the N quadrature-phase DSM signals output from the second DSM into a quadrature-phase RF signal using a second oscillation signal. The first and second oscillation signals may have a 90-degree phase difference from each other.

The first digital RF converter may be configured to arrange the N in-phase DSM signals into K in-phase parallel signals, to delay the K in-phase parallel signals by different delay times, and to convert the delayed signals into the in-phase RF signal using the first oscillation signal, where K is a positive integer greater than N.

The second digital RF converter may be configured to arrange the N quadrature-phase DSM signals into K quadrature-phase parallel signals, to delay the K quadrature-phase parallel signals by different delay times, and to convert the delayed signals into the quadrature-phase RF signal using the second oscillation signal.

Output signals of the first and second digital RF converters may be processed by a power amplifier and a filter, and then transmitted through an antenna.

The first serial-to-parallel converter may include an interpolator configured to interpolate the serial in-phase digital input signal and the second serial-to-parallel converter may include an interpolator configured to interpolate the serial quadrature-phase digital input signal.

Each of the first and second DSMs may include first through N-th channel DSM units. Each of the first through N-th channel DSM units in the first DSM may be configured to perform at least one addition, at least one delay, and at least one binary quantization to a corresponding one of the N in-phase parallel signals. Each of the first through N-th channel DSM units in the second DSM may be configured to perform at least one addition, at least one delay, and at least one binary quantization to the N quadrature-phase parallel signals, respectively. Each of the first through N-th channel DSM units in the first DSM may use a signal generated by at least one of the other channel DSM units in the first DSM as an input in the at least one addition to the N in-phase parallel signal. Each of the first through N-th channel DSM units in the second DSM may use a signal generated by at least one of the other channel DSM units in the second DSM as an input in the at least one addition to the N quadrature-phase parallel signal.

The first digital RF converter may include a re-parallelization module and a delay module. The re-parallelization module may be configured to re-parallelize the N in-phase DSM signals output from the first DSM into K in-phase parallel DSM signals, where K is a positive integer greater than N. The delay module may be configured to delay the K in-phase parallel DSM signals. The second digital RF converter may include a re-parallelization module and a delay module. The re-parallelization module in the second digital RF converter may be configured to re-parallelize the N quadrature-phase DSM signals output from the second DSM into K quadrature-phase parallel DSM signals. The delay module in the second digital RF converter may be configured to delay the K quadrature-phase parallel DSM signals.

According to an embodiment of the inventive concept, there is provided a wireless communication system. The wireless communication system includes a processor and a digital wireless transmitter connected to the processor. The digital wireless transmitter includes a serial-to-parallel converter, a DSM, a digital RF converter, and a power amplifier. The serial-to-parallel converter may be configured to convert a serial digital input signal into N parallel signals, where N is a positive integer greater than one. The DSM may be configured to perform delta-sigma modulation on the N parallel signals in parallel. The digital RF converter may be configured to perform a moving average filtering and an RF conversion to the N delta-sigma modulated signals and to generate an RF signal. The power amplifier may be configured to amplify the RF signal.

The serial-to-parallel converter may be configured to perform an over-sampling to the serial digital input signal and to generate the N parallel signals.

The N delta-sigma modulated signals may be a stream of single-bit signals.

The digital RF converter may be configured to arrange the N delta-sigma modulated signals into K parallel signals, to delay the K parallel signals by different delay times, respectively, and to convert the delayed signals into the RF signal, where K is a positive integer greater than N.

The digital wireless transmitter may further include a band pass filter configured to filter the RF signal.

According to an embodiment of the inventive concept, there is provided a wireless transmitter. The wireless transmitter includes a serial-to-parallel converter and a DSM. The serial-to-parallel converter may be configured to covert a serial input signal into at least a first parallel signal and a second parallel signal. The DSM may be configured to perform delta-sigma modulation to the at least first parallel signal and the second parallel signal. The DSM includes a first channel DSM unit and a second channel DSM unit. The first channel DSM unit is configured to perform at least one addition to the first parallel signal and uses a signal generated by the second channel DSM unit as an input in the at least one addition.

The second channel DSM unit may be configured to perform at least one addition to the second parallel signal and may use a signal generated by the first channel DSM unit as an input in the at least one addition.

Each of the first channel DSM unit and the second channel DSM unit may output a stream of single-bit signals.

BRIEF DESCRIPTION OF THE DRAWINGS

The aforementioned features of the present inventive concept will become more apparent by describing in detail exemplary embodiments thereof with reference to the attached drawings in which:

FIGS. 13A through 13F are graphs of signal spectrum of the digital wireless transmitter illustrated in FIG. 12, according to an embodiment of the inventive concept.

DETAILED DESCRIPTION OF THE EMBODIMENTS

The inventive concept now will be described more fully hereinafter with reference to the accompanying drawings, in which embodiments of the invention are shown. This invention may, however, be embodied in various forms and should not be construed as being limited to the embodiments set forth herein. Rather, these embodiments are provided so that this disclosure will be thorough and complete, and will fully convey the scope of the invention to those skilled in the art. Like numbers may refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

Figure 1:
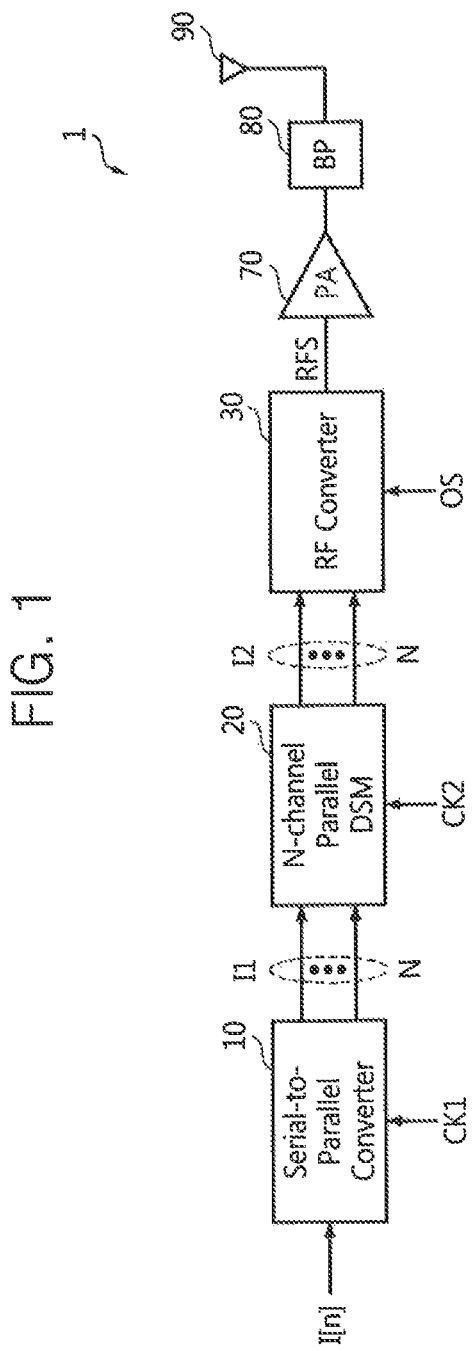
FIG. 1 is a schematic block diagram of a digital wireless transmitter according to an embodiment of the inventive concept.

FIG. 1 is a schematic block diagram of a digital wireless transmitter 1 according to an embodiment of the inventive concept. The digital wireless transmitter 1 may include a serial-to-parallel converter 10, an N-channel parallel delta-sigma modulator (DSM) module 20, a radio frequency (RF) converter 30, a power amplifier 70, a band pass filter 80, and an antenna 90.

The serial-to-parallel converter 10 may convert a serial input signal I[n] into N parallel signals I1 (where N is a positive integer of at least 2). The input signal I[n] and the output signal I1 of the serial-to-parallel converter 10 may be digital signals.

The serial-to-parallel converter 10 may include an interpolator that interpolates the digital input signal I[n] P times (where P is a positive integer) to generate the N parallel signals I1. Here, at least one interpolator may be provided. For instance, the serial-to-parallel converter 10 may interpolate the digital serial input signal I[n] L times (where L is a positive integer) and then perform an M-time interpolation (where M is a positive integer) to generate the N parallel signals I1. In this case, the whole number of interpolations "P" performed in the serial-to-parallel converter 10 may be the product of L and M, i.e., P=L*M, where * denotes a multiplication. The serial-to-parallel converter 10 may operate in response to a first clock signal CK1. The first clock signal CK1 may have a frequency that is a multiple of a sampling rate of the digital input signal I[n].

The N-channel parallel DSM module 20 may receive the N parallel signals I1 generated from the serial-to-parallel converter 10, perform delta-sigma modulation on the N parallel signals I1, and output N parallel delta-sigma modulated signals I2. The N-channel parallel DSM module 20 may operate in response to a second clock signal CK2. The second clock signal CK2 may have a frequency that is a multiple of the sampling rate of the digital input signal I[n]. The second clock signal CK2 may have the same frequency as the first clock signal CK1, or have a different frequency than the first clock signal CK1. The operation and structure of the DSM module 20 will be described later.

The RF converter 30 may convert the N parallel delta-sigma modulated signal I2 output from the DSM module 20 into an RF signal RFS. The output signal I2 of the DSM module 20 may be a low-frequency (e.g., baseband) digital signal.

Although not shown in FIG. 1, the RF converter 30 may include a digital filter and a digital-to-analog converter (DAC). The digital filter may be implemented based on a moving average filter. The DAC may generate an RF analog signal RFS by mixing a baseband digital signal with an oscillation signal OS. The operation and structure of the RF converter 30 will be described later.

The RF analog signal RFS output from the RF converter 30 may be amplified by a power amplifier 70, filtered by a band pass filter 80 into a predetermined band signal, and then transmitted through an antenna 90 to a receiver (not shown). The digital wireless transmitter 1 may also include an additional element such as an oscillation signal generator that generates the oscillation signal OS.

Figure 2:
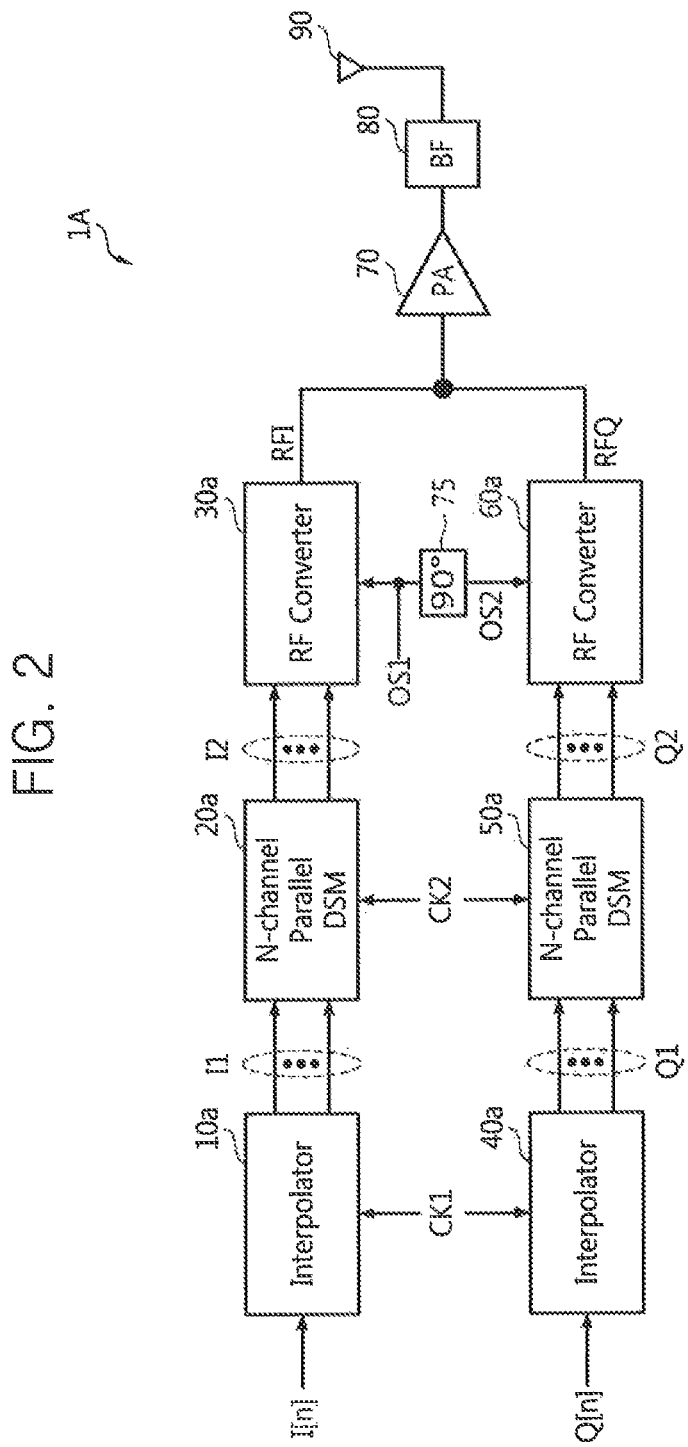
FIG. 2 is a schematic block diagram of a digital wireless transmitter according to an embodiment of the inventive concept.

FIG. 2 is a schematic block diagram of a digital wireless transmitter 1A according to an embodiment of the inventive concept. Referring to FIG. 2, the digital wireless transmitter 1A may include first and second serial-to-parallel converters 10a and 40a, first and second N-channel parallel DSM modules 20a and 50a, first and second RF converters 30a and 60a, a power amplifier 70, a band pass filter 80, and a phase shifter 75. The digital wireless transmitter 1A may be a quadrature transmitter for transmitting a quadrature signal including an in-phase signal and a quadrature-phase signal.

The first serial-to-parallel converter 10a, the first N-channel parallel DSM module 20a, and the first RF converter 30a may form a path for receiving and processing the in-phase digital input signal I[n] and have the substantially same structure and function as the serial-to-parallel converter 10, the N-channel parallel DSM module 20, and the RF converter 30 of FIG. 1, respectively. The second serial-to-parallel converter 40a, the second N-channel parallel DSM module 50a, and the second RF converter 60a may form a path for receiving and processing a quadrature-phase digital input signal Q[n] and have the substantially same structure and function as the serial-to-parallel converter 10, the N-channel parallel DSM module 20, and the RF converter 30 of FIG. 1, respectively, except for the signal that they process.

The first RF converter 30a may convert N in-phase DSM signals I2 generated from the first N-channel parallel DSM module 20a into an in-phase RF signal RFI using a first oscillation signal OS1. The second RF converter 60a may convert N quadrature-phase DSM signals Q2 output from the second N-channel parallel DSM module 50a into a quadrature-phase RF signal RFQ using a second oscillation signal OS2.

The second oscillation signal OS2 may have a 90-degree phase difference from the first oscillation signal OS1. The phase shifter 75 may shift a phase of the first oscillation signal OS1 by 90 degrees to output the second oscillation signal OS2.

The in-phase RF signal RFI output from the first RF converter 30a and the quadrature-phase RF signal RFQ output from the second RF converter 60a are input to the power amplifier 70. An amplified signal output from the power amplifier 70 may be filtered by the band pass filter 80 and then transmitted to a receiver (not shown) through the antenna 90.

Figure 3:
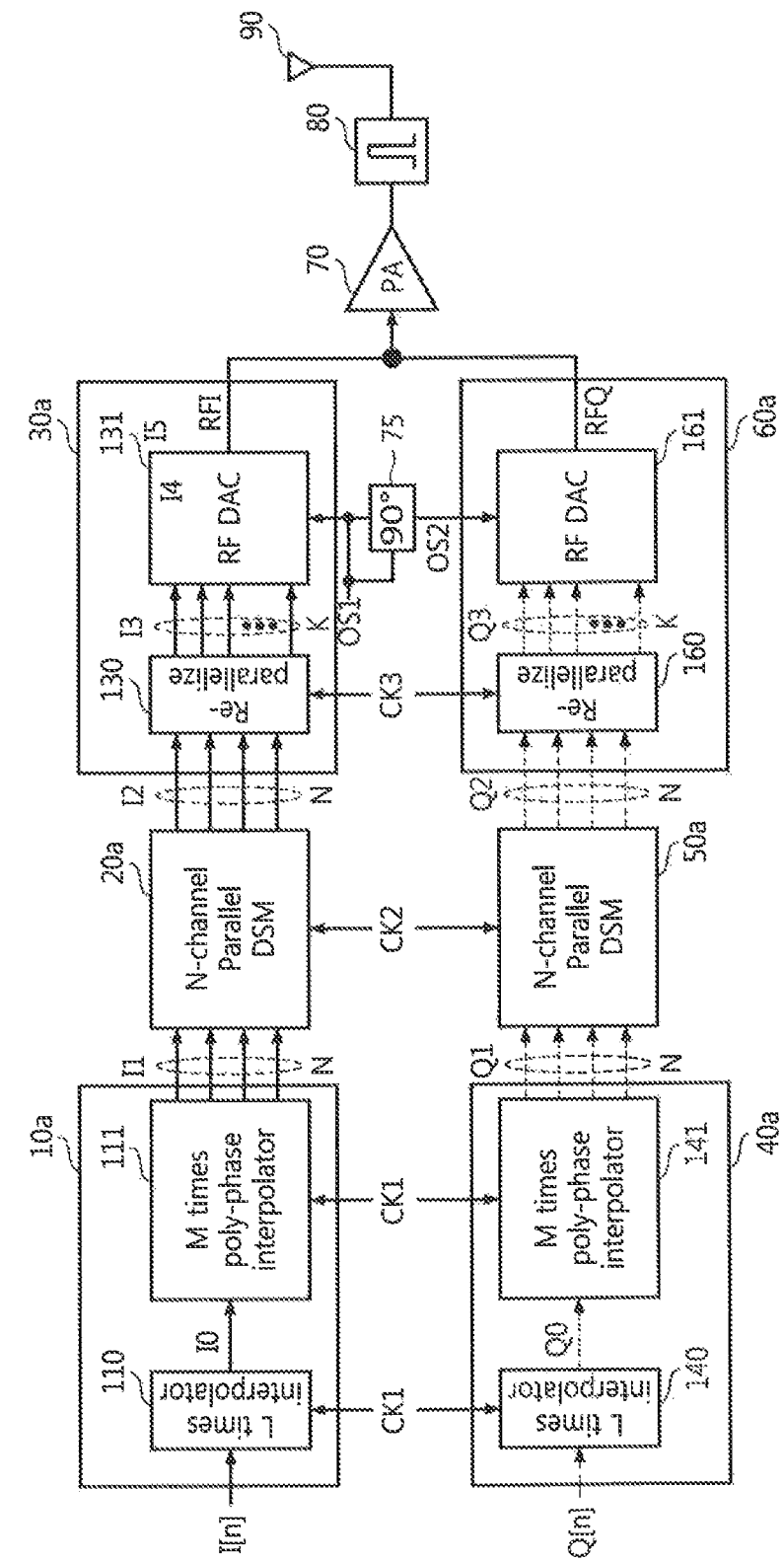
FIG. 3 is a detailed block diagram of the digital wireless transmitter illustrated in FIG. 2 according to an embodiment of the inventive concept.

FIG. 3 is a detailed block diagram of the digital wireless transmitter 1A illustrated in FIG. 2. Referring to FIG. 3, the first serial-to-parallel converter 10a may include a first interpolator 110 and a second interpolator 111. The first interpolator 110 may perform an L-time interpolation to the serial digital input signal I[n] and output a serial signal I0. The second interpolator 111 may perform an M-time interpolation to the L-time interpolated signal (i.e., the serial signal I0) and output the N parallel signals I1. At this time, M may be the same as N, but the inventive concept is not restricted thereto. The second interpolator 111 may be implemented using a poly-phase interpolator.

When the frequency of the digital input signal I[n] that inputs to the first interpolator 110 is a baseband frequency FB, the first interpolator 110 may operate at an operating frequency which is L times of the baseband frequency FB (i.e., L*FB, where "*" denotes a multiplication). For instance, the first interpolator 110 may operate in response to the first clock signal CK1 having the L times frequency of the baseband frequency FB. When M is the same as N, the second interpolator 111 may also operate at an operating frequency of L*FB. In other words, the same clock signal CK1 may be input to both the first and second interpolators 110 and 111. When L is 32, M is 4, and N is 4, the frequency of the first clock signal CK1 input to the first and second interpolators 110 and 111 may be 32 FB.

Figure 4:
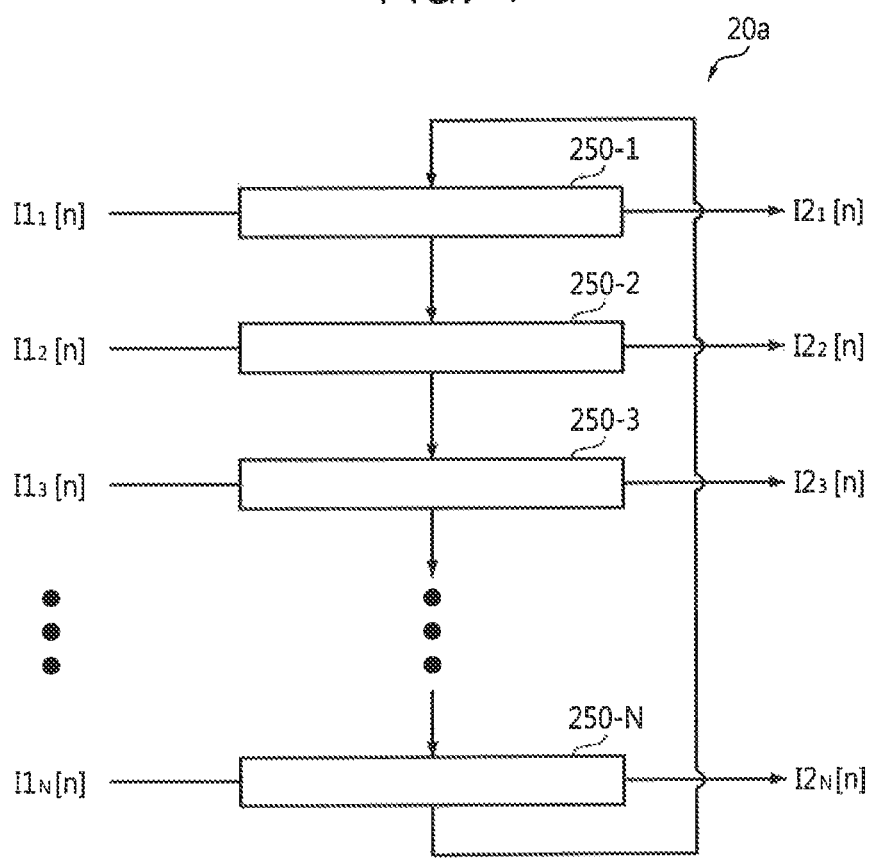
FIG. 4 is a block diagram of an N-channel parallel delta-sigma modulator (DSM) module included in the digital wireless transmitter illustrated in FIG. 3 according to an embodiment of the inventive concept.

FIG. 4 is a block diagram of the N-channel parallel DSM module 20a illustrated in FIG. 3. Referring to FIG. 4, the first N-channel parallel DSM module 20a may include N DSM units (i.e., first through N-th channel DSM units 250-1 through 250-N) that receive the N parallel signals I1 (i.e., $I1_1[n]$ through $I1_N[n]$), and perform delta-sigma modulation on the N parallel signals $I1_1[n]$ through $I1_N[n]$, respectively.

Each of the first through N-th channel DSM units 250-1 through 250-N may: receive a corresponding one of the N parallel signals $I1_1[n]$ through $I1_N[n]$; perform at least one addition, at least one delay, and at least one binary quantization to the one of the N parallel signals $I1_1[n]$ through $I1_N[n]$; and output a corresponding one of the delta-sigma modulated output signals I2, i.e., $I2_1[n]$ through $I2_N[n]$. At this time, the N parallel signals $I1_1[n]$ through $I1_N[n]$ may be input to a corresponding one of the first through N-th channel DSM units 250-1 through 250-N, respectively, and the output signals $I2_1[n]$ through $I2_N[n]$ may be output from the first through N-th channel DSM units 250-1 through 250-N, respectively. Further, the N parallel signals $I1_1[n]$ through $I1_N[n]$ may be multi-bit (e.g., 12-bit) signals oversampled by an interpolator and the output signals $I2_1[n]$ through $I2_N[n]$ may be binary signals (i.e., a stream of 1-bit signals). However, the inventive concept is not restricted to the embodiments of the present inventive concept. For example, the N parallel signals $I1_1[n]$ through $I1_N[n]$ may be binary signals in an embodiment.

Each of the first through N-th channel DSM units 250-1 through 250-N may be coupled to at least one of the other DSM units and use a signal generated by the at least one DSM unit as an input of the at least one addition. Each of the first through N-th channel DSM units 250-1 through 250-N may be a second-order low-pass DSM unit, but the inventive concept is not restricted thereto. For example, each of the first through N-th channel DSM units 250-1 through 250-N may be a first-order low-pass DSM unit or a third- or a higher-order low-pass DSM unit.

Referring to FIG. 4, the first through N-th channel DSM units 250-1 through 250-N may be connected with each other. For example, a signal generated by the first channel DSM unit 250-1 may be input to the second channel DSM unit 250-2, a signal generated by the second channel DSM unit 250-2 may be input to the third channel DSM unit 250-3, and likewise, a signal generated by the (N–1)-th channel DSM unit 250-(N–1) may be input to the N-th channel DSM unit 250-N. However, the inventive concept is not restricted to the embodiments illustrated in FIG. 4. Each of the first through N-th channel DSM units 250-1 through 250-N may be coupled to a different channel DSM unit in various ways.

Figure 5:
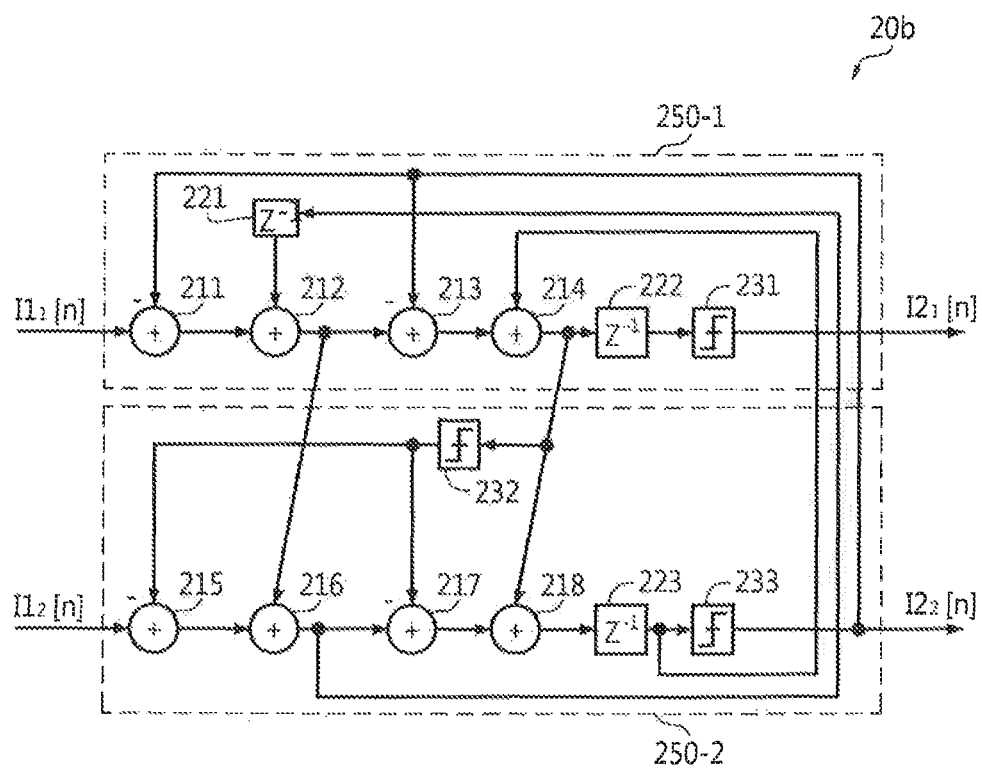
FIG. 5 is a block diagram an N-channel parallel DSM module illustrated in FIG. 4, according to an embodiment of the inventive concept.

FIG. 5 is a block diagram of an N-channel parallel DSM module 20a illustrated in FIG. 3, according to an embodiment of the inventive concept. Here, N is 2. Referring to FIG. 5, a first N-channel parallel DSM module 20b may include two DSM units (i.e., the first and second channel DSM units 250-1 and 250-2) which receive two parallel signals $I1_1[n]$ and I1$_2$[n], respectively and perform delta-sigma modulation to the two parallel signals I1$_1$[n] and I1$_2$[n].

The first channel DSM unit 250-1 may include first through fourth adders 211 through 214, first and second delay units 221 and 222, and a first quantizer 231. The second channel DSM unit 250-2 may include fifth through eighth adders 215 through 218, a third delay unit 223, and second and third quantizers 232 and 233.

In the first channel DSM unit 250-1, the first adder 211 may add the first parallel signal I1$_1$[n] among N parallel signals and an output signal I2$_2$[n] of the second channel DSM unit 250-2. The second adder 212 may add an output signal of the first adder 211 and an output signal of the first delay unit 221 that delays an output signal of the sixth adder 216 of the second channel DSM unit 250-2. The third adder 213 may add an output signal of the second adder 212 and the output signal I2$_2$[n] of the second channel DSM unit 250-2. The fourth adder 214 may add an output signal of the third adder 213 and an output signal of the third delay unit 223 of the second channel DSM unit 250-2. The second delay unit 222 may delay an output signal of the fourth adder 214 by a predetermined time (e.g., one clock cycle). The first quantizer 231 may quantize an output signal of the second delay unit 222 into a binary signal and output the binary signal as an output signal I2$_1$[n].

In the second channel DSM unit 250-2, the second quantizer 232 may quantize the output signal of the fourth adder 214 of the first channel DSM unit 250-1 into a binary signal. The fifth adder 215 may add the second parallel signal I1$_2$[n] among the two parallel signals and the output signal of the second quantizer 232. The sixth adder 216 may add an output signal of the fifth adder 215 and the output signal of the second adder 212 of the first channel DSM unit 250-1. The seventh adder 217 may add the output signal of the sixth adder 216 and the output signal of the second quantizer 232. The eighth adder 218 may add an output signal of the seventh adder 217 and the output signal of the fourth adder 214 of the first channel DSM unit 250-1. The third delay unit 223 may delay an output signal of the eighth adder 218 by a predetermined time (e.g., one clock cycle). The third quantizer 233 may quantize the output signal of the third delay unit 223 into a binary signal and output a binary signal as the output signal I2$_2$[n]. For example, at least one of the first through third quantizers 231 through 233 may be implemented using a digital binary comparator that compares an input value with a predetermined value and outputs the comparison result as a binary signal.

Although not shown, the first through eighth adders 211 through 218, the first through third delay units 221 through 223, and the first through third quantizers 231 through 233 of the first N-channel parallel DSM module 20b may operate in response to the second clock signal CK2. The second clock signal CK2 may have a frequency which is a multiple of the frequency (or the sampling rate) of the digital input signal I[n] and may have the same frequency as or a different frequency than the first clock signal CK1. When the frequency of the digital input signal I[n] is FB, L is 32, M is 4, and N is 4, the frequency of the second clock signal CK2 may be 32 FB.

Figure 6:
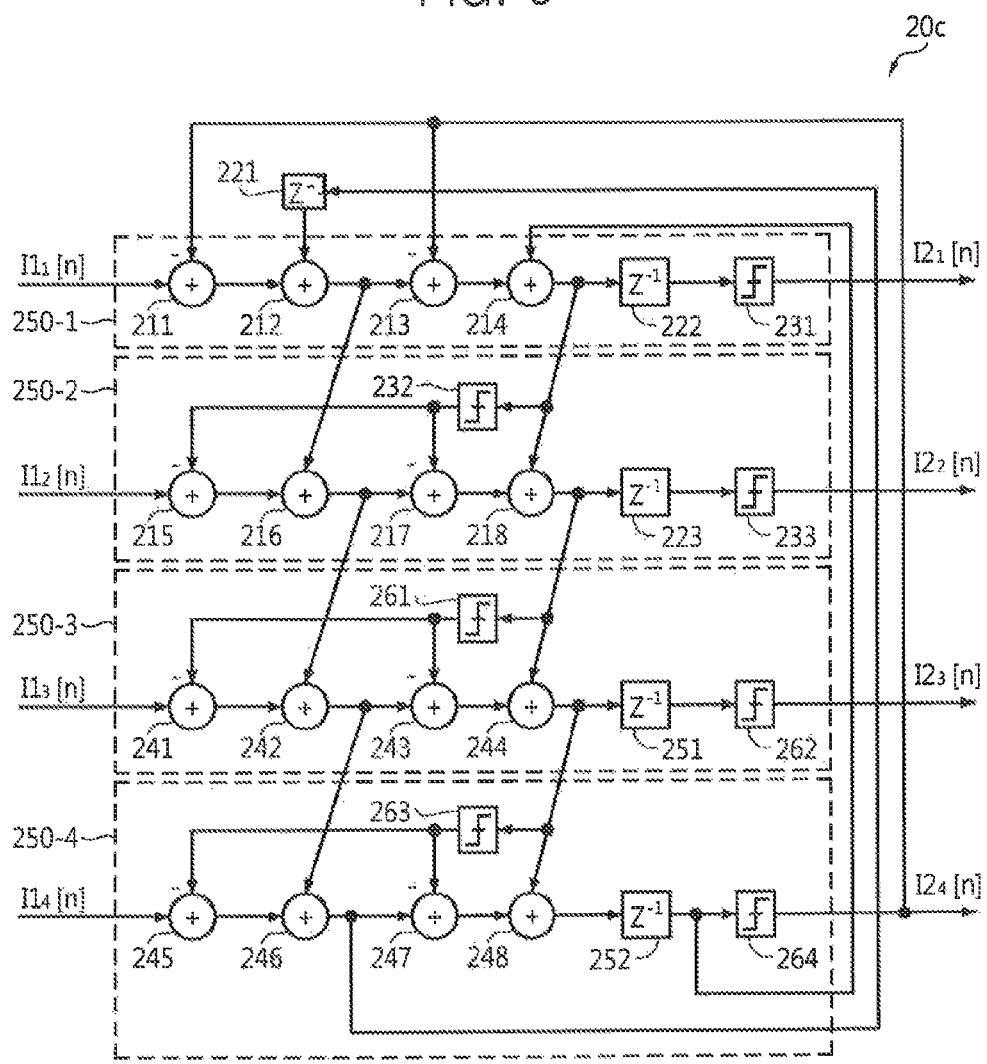
FIG. 6 is a block diagram an N-channel parallel DSM module illustrated in FIG. 4, according to an embodiment of the inventive concept.

FIG. 6 is a block diagram of an N-channel parallel DSM module 20a illustrated in FIG. 3, according to an embodiment of the inventive concept. Here, N is 4. Referring to FIG. 6, a first N-channel parallel DSM module 20c may include four DSM units (i.e., first through fourth channel DSM units 250-1 through 250-4) that receive four parallel signals I1$_1$[n] through I1$_4$[n], respectively, and perform delta-sigma modulation to the four parallel signals I1$_1$[n] through I1$_4$[n].

The first channel DSM unit 250-1 illustrated in FIG. 6 has the substantially same structure as the first channel DSM unit 250-1 illustrated in FIG. 5. The second channel DSM unit 250-2 illustrated in FIG. 6 has the substantially same structure as the second channel DSM unit 250-2 illustrated in FIG. 5. The third and fourth channel DSM units 250-3 and 250-4 have the substantially same structure as the second channel DSM unit 250-2 of FIG. 5. Likewise, an N-th channel DSM unit (not shown in FIG. 6) may have the substantially same structure as the second channel DSM unit 250-2 of FIG. 5 and hence, more DSM units having the substantially same structure as the second channel DSM unit 250-2 may be added. Accordingly, in addition to the embodiments where N is 2 or 4, there may be embodiments where N is a positive integer of at least 2.

As described above, the N-channel parallel DSM modules 20 and 20a through 20c have a structure in which N channels are parallel and thus reduce an operating frequency to 1/N as compared to a single channel structure. Accordingly, the operating frequency of the N-channel parallel DSM modules 20 and 20a through 20c is substantially the same as the sampling rate of each of the N parallel signals output from the second interpolator 111.

For example, when the number of interpolations is L*M (e.g., 128 when L is 32 and M is 4), a single channel DSM module may have an operating frequency which is L*M times higher than the baseband frequency FB, but the N-channel parallel DSM modules 20 and 20a through 20c according to an embodiment of the inventive concept have an operating frequency dropping to a feasible level.

Figure 7:
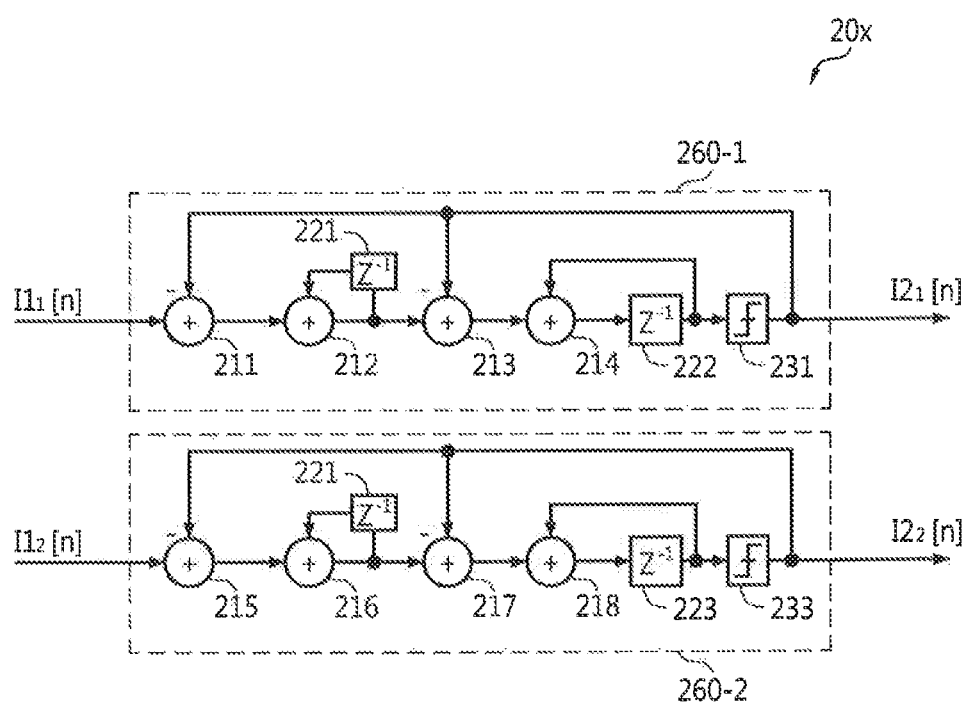
FIG. 7 is a block diagram an N-channel parallel DSM module illustrated in FIG. 4, according to an embodiment of the inventive concept.

FIG. 7 is a block diagram of an N-channel parallel DSM module 20a illustrated in FIG. 3, according to an embodiment of the inventive concept. It is assumed that N is 2 in FIG. 7. Referring to FIG. 7, similarly to the N-channel parallel DSM module 20b illustrated in FIG. 5, an N-channel parallel DSM module 20x may include first and second DSM units 260-1 and 260-2 which receive two parallel signals I1$_1$[n] and I1$_2$[n] and perform delta-sigma modulation to the two parallel signals I1$_1$[n] and I1$_2$[n].

However, the first and second DSM units 260-1 and 260-2 are not coupled with each other, and thus, do not use each other's signal. In other words, the first and second DSM units 260-1 and 260-2 may operate independently from each other. When the N-channel parallel DSM module 20x processes different-channel parallel signals independently at a low operating speed (i.e., a 1/N operating frequency as compared to a single channel) as in the embodiment of FIG. 7, a signal-to-quantization noise ratio (SQNR) may be lower as compared to a single-channel DSM.

Contrarily, in the N-channel parallel DSM modules 20 and 20a through 20c according to embodiments of the inventive concept, DSM units are coupled with each other, so that the SQNR may be barely lowered as compared to the single-channel DSM. In addition, when output signals of the N-channel parallel DSM modules 20 and 20a through 20c are 1-bit signals, they may be easily converted into an RF signal using a unit Gilbert cell circuit, which will be described later.

Figure 8:
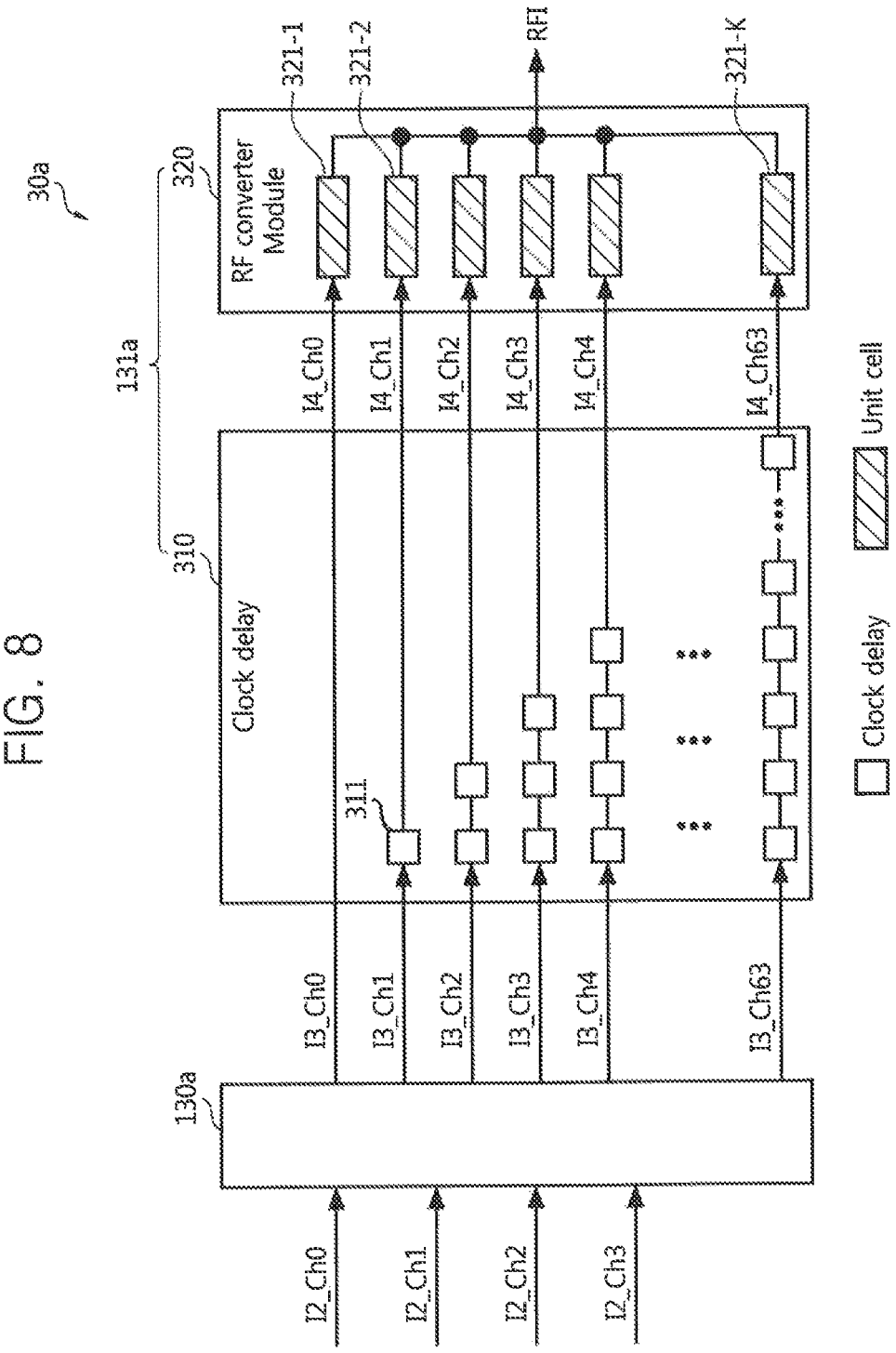
FIG. 8 is a block diagram of a radio frequency (RF) converter illustrated in FIG. 3, according to an embodiment of the inventive concept.
Figure 9:
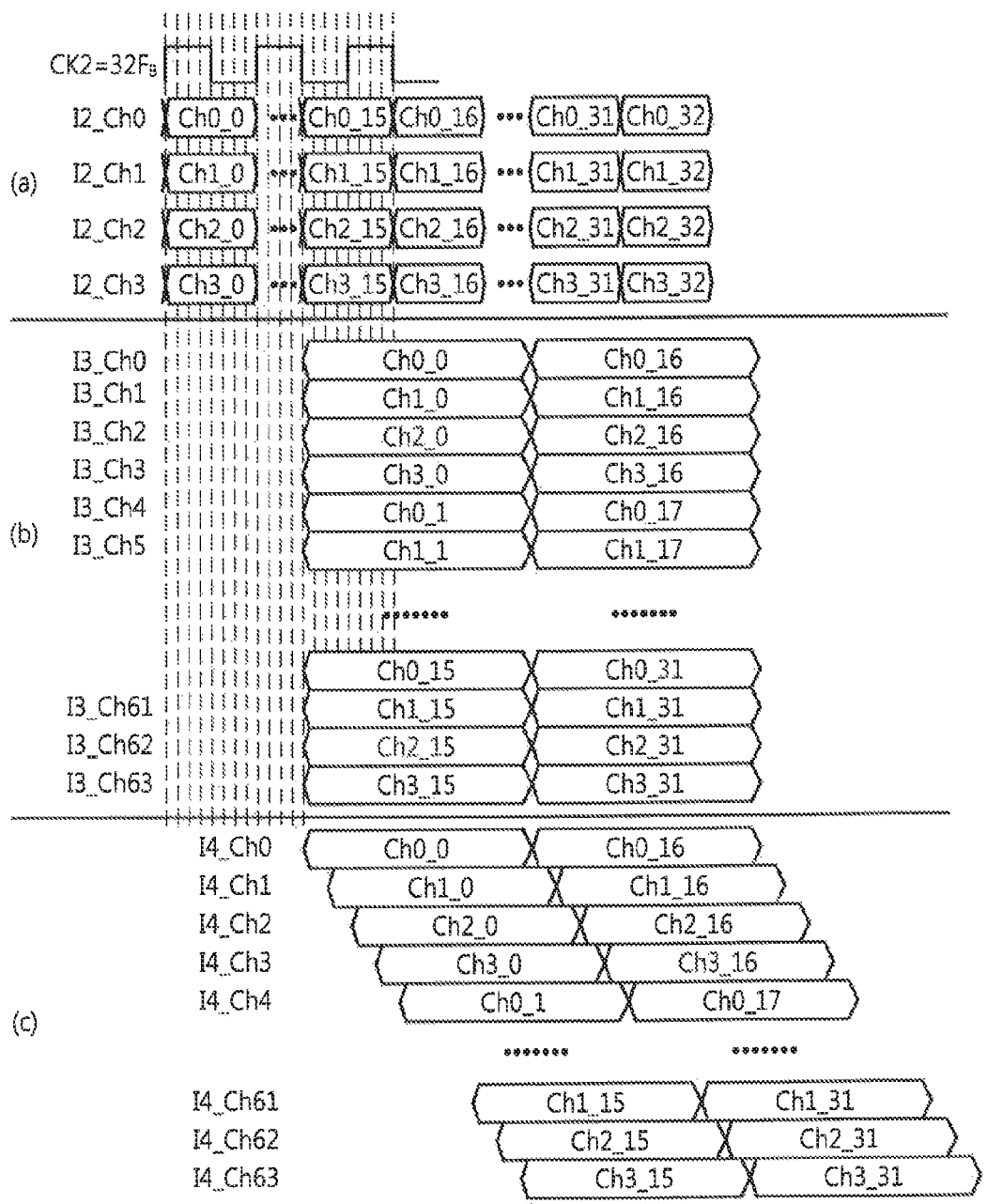
FIG. 9 is a signal timing chart showing an operation of the RF converter illustrated in FIG. 8, according to an embodiment of the inventive concept.

FIG. 8 is a block diagram of the RF converter 30a illustrated in FIG. 3. FIG. 9 is a signal timing chart showing an operation of the RF converter 30a illustrated in FIG. 8. Referring to FIG. 8, the RF converter 30a may include a re-parallelization module 130a and an RF digital-to-analog converter (DAC) 131a. It is assumed that N is 4 and K is 64 in the embodiments illustrated in FIGS. 8 and 9, but the inventive concept is not restricted to those embodiments. Here, K may be a positive integer greater than N.

The re-parallelization module 130a may operate in response to a third clock signal CK3. The re-parallelization module 130a may re-parallelize four parallel DSM signals I2_Ch0 through I2_Ch3 output from the first N-channel parallel DSM module 20a into K (i.e., 64) parallel DSM signals and output first through K-th re-parallelized signals I3_Ch0 through I3_Ch63, where K is an integer greater than N. The re-parallelization module 130a may re-parallelize N channels into K channels, and thus, create more number of parallel channels. The frequency of the first through K-th re-parallelized signals I3_Ch0 through I3_Ch63 may be formulated as: FS/(K/N), where the FS may be a L*FB.

To re-parallelize the N parallel DSM signals I2_Ch0 through I2_Ch3 into K parallel DSM signals I3_Ch0 through I3_Ch63, the re-parallelization module 130a may parallelize sixteen signals (e.g., Ch0_0 through Ch0_15, Ch1_0 through Ch1_15, Ch2_0 through Ch2_15, or Ch3_0 through Ch3_15) of each of the N parallel DSM signals I2_Ch0 through I2_Ch3 into K (i.e., 64) re-parallelized signals. The sixteen signals of each of the N parallel DSM signals I2_Ch0 through I2_Ch3 may be serially arranged and correspond to sixteen clock cycles of each of the N parallel DSM signals I2_Ch0 through I2_Ch3 as shown in part (a) of FIG. 9. In other words, each of the N parallel DSM signals I2_Ch0 through I2_Ch3 may produce 16 re-parallelized signals, since N is 4, thus the re-parallelization module 130a may produce 64 re-parallelized signals I3_Ch0 through I3_Ch63 shown in part (b) of FIG. 9. The K re-parallelized signals I3_Ch0 through I3_Ch63 may be input to the RF DAC 131a.

The RF DAC 131a may include a delay module 310 and an RF converter module 320. The delay module 310 may delay the first through K-th re-parallelized signals I3_Ch0 through I3_Ch63 so that each of the first through K-th re-parallelized signals I3_Ch0 through I3_Ch63 may have a delay time difference of one clock cycle from an adjacent one thereof. For instance, the first re-parallelized signal I3_Ch0 may have a delay time of "0", i.e., no delay. When the signal shifts from the first re-parallelized signal I3_Ch0 toward the K-th re-parallelized signal I3_Ch63 one by one, the delay time may be increased by one clock cycle at each time of the shift. For this operation, the delay module 310 may include first through K-th delay units. The delay time of the m-th delay unit may correspond to (m−1) clock cycles, where "m" is a positive integer of at least 1 and at most K. For instance, the second re-parallelized signal I3_Ch1 is input to the RF converter module 320 after being delayed by one clock cycle and the third re-parallelized signal I3_Ch2 is input to the RF converter module 320 after being delayed by two clock cycles.

In FIG. 8, reference numeral 311 may denote a unit delay element that delays an input signal by one cycle of an input clock (not shown). When the number of unit delay elements 311 connected in series is increased one by one, the delay time of the first through K-th re-parallelized signals I3_Ch0 through I3_Ch63 may be sequentially increased as shown in part (c) of FIG. 9. The RF converter module 320 may include a plurality of unit Gilbert cell circuits 321-1 through 321-K which convert a corresponding output signal of the first through K-th delay units into an RF signal RFS.

Figure 10:
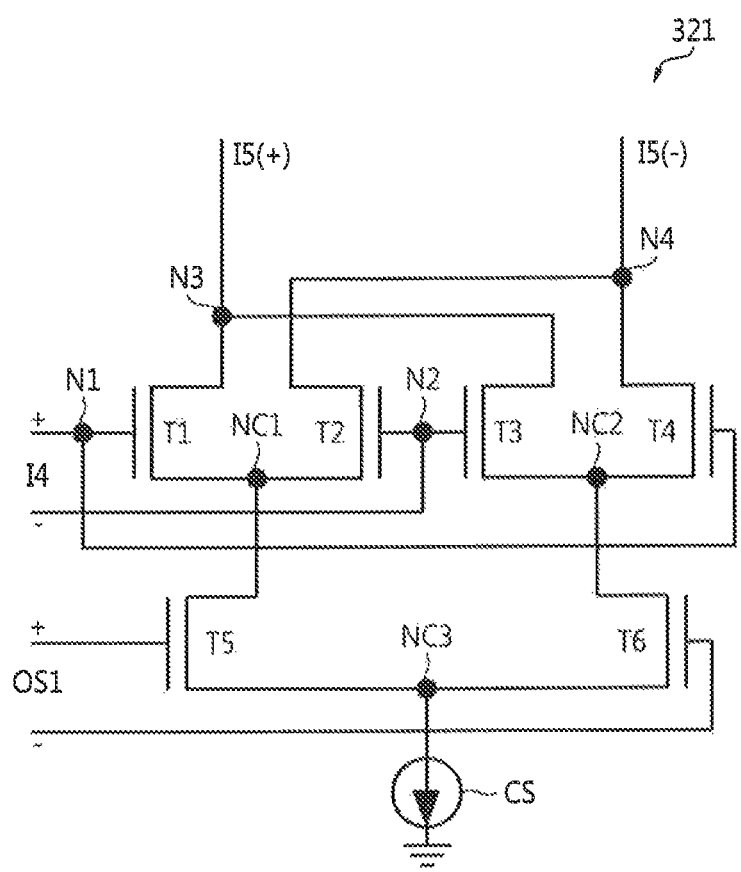
FIG. 10 is a circuit diagram of a unit Gilbert cell circuit illustrated in FIG. 8, according to an embodiment of the inventive concept.

FIG. 10 is a circuit diagram of one of the plurality of unit Gilbert cell circuits 321-1 through 321-64 illustrated in FIG. 8. The plurality of unit Gilbert cell circuits 321-1 through 321-64 may have the substantially same structure to each other. One of the plurality of unit Gilbert cell circuits 321-1 through 321-64 may include first through sixth transistors T1 through T6 and a current source CS. The first transistor T1 may have a gate connected to a first input node N1, a source connected to a first common source node NC1, and a drain connected to a first output node N3. The second transistor T2 may have a gate connected to a second input node N2, a source connected to the first common source node NC1, and a drain connected to a second output node N4. The third transistor T3 may have a gate connected to the second input node N2, a source connected to a second common source node NC2, and a drain connected to the output node N3. The fourth transistor T4 may have a gate connected to the first input node N1, a source connected to the second common source node NC2, and a drain connected to the second output node N4.

The fifth transistor T5 may be connected between the first common source node NC and a current source node NC3, and receive a positive (+) signal of the first oscillation signal OS1 through a gate thereof. The sixth transistor T6 may be connected between the second common source node NC2 and the current source node NC3, and receive a negative (−) signal of the first oscillation signal OS1 through a gate thereof. A corresponding one of the output signal I4_Ch0 through I4_Ch64 of the delay units may be input to the first and second input nodes N1 and N2.

Figure 11:
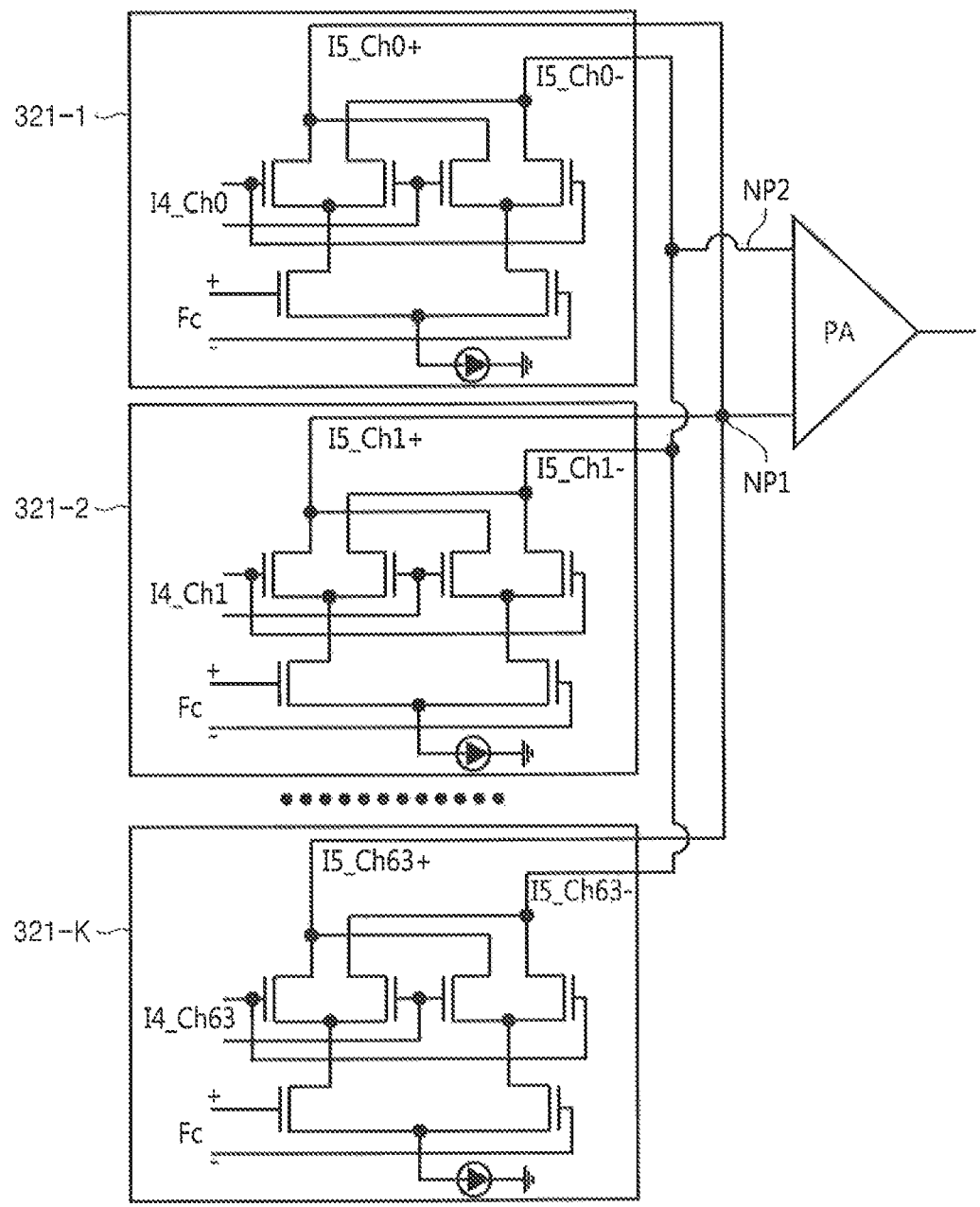
FIG. 11 is a circuit diagram illustrating connections among a plurality of unit Gilbert cell circuits illustrated in FIG. 10, according to an embodiment of the inventive concept.

FIG. 11 is a diagram illustrating the connection among the plurality of the unit Gilbert cell circuits 321-1 through 321-K. The first output nodes N3 of the unit Gilbert cell circuits 321-1 through 321-K may be connected in common to a first input terminal NP1 of a power amplifier PA 70. The second output nodes N4 of the unit Gilbert cell circuits 321-1 through 321-K may be connected in common to a second input terminal NP2 of the power amplifier PA 70. In other words, signals of the first output nodes N3 of the unit Gilbert cell circuits 321-1 through 321-K may be combined and input to the first input terminal NP1 of the power amplifier PA 70 and signals of the second output nodes N4 of the unit Gilbert cell circuits 321-1 through 321-K may be combined and input to the second input terminal NP2 of the power amplifier PA 70.

Accordingly, the power amplifier PA 70 may combine and amplify output signals of the unit Gilbert cell circuits 321-1 through 321-K. The K re-parallelized signals output from the re-parallelization module 130a may be delayed by different delay times, respectively, and then combined in the RF DAC 131a. This operation is similar to an operation of a moving average filter. In addition to this filtering operation described above, the RF DAC 131a may also perform an up-conversion to the delayed signals into a carrier frequency to generate the RF signal RFS.

Re-parallelizing by the re-parallelization module 130a may be functionally similar to adjusting the number of tabs in the moving average filter, and as a result, increase a filtering performance. Since a high over-sampling rate (OSR) (e.g., 128 times or higher) of a DSM leads to an increase in out-of-band quantization noise, an RF band pass filter (BPF) may get complex when the high OSR is not reduced by using a primary filtering in digital domain.

According to an embodiment of the inventive concept, a level of the out-of-band quantization noise may be reduced due to the re-parallelization (or moving average filtering). As a result, a receiving sensitivity of a final signal may be increased.

Referring back to FIG. 3, the structures and operations of the second serial-to-parallel converter 40a, the second N-channel parallel DSM module 50a, and the second RF converter 60a may be substantially the same as those of the first serial-to-parallel converter 10a, the first N-channel parallel DSM module 20a, and the first RF converter 30a, respectively. The second serial-to-parallel converter 40a, the second N-channel parallel DSM module 50a, and the second RF converter 60a may receive and process the quadrature-phase digital input signal Q[n]. Thus, detailed descriptions of similar features will be omitted.

The output signal RFQ of the second RF converter 60a may also be input to the power amplifier 70. For instance, the first output nodes N3 of the unit Gilbert cell circuits 321-1 through 321-K in the second RF converter 60a may be connected in common to the first input terminal NP1 of the power amplifier PA. The second output nodes N4 of the unit Gilbert cell circuits 321-1 through 321-K connected in common to the second input terminal NP2 of the power amplifier PA 70. The unit Gilbert cell circuits 321-1 through 321-K of the second RF converter 60a may be substantially the same as those of the first RF converter 30a, with the exception that the unit Gilbert cell circuits 321-1 through 321-K of the second RF converter 60a may receive the second oscillation signal OS2.

Accordingly, signals of the respective first output nodes N3 of the respective unit Gilbert cell circuits 321-1 through 321-K may be combined and input to the first input terminal NP1 of the power amplifier PA 70, and signals of the respective second output nodes N4 of the respective unit Gilbert cell circuits 321-1 through 321-K may be combined and input to the second input terminal NP2 of the power amplifier PA 70. Therefore, the power amplifier PA 70 may combine and amplify: output signals of the respective unit Gilbert cell circuits 321-1 through 321-K of the first RF converter 30a; and output signals of the respective unit Gilbert cell circuits 321-1 through 321-K of the second RF converter 60a.

Referring FIGS. 8 through 11, although the embodiments when N and K are 4 and 16 are described as an example, the present inventive concept is not restricted to thereto.

Figure 12:
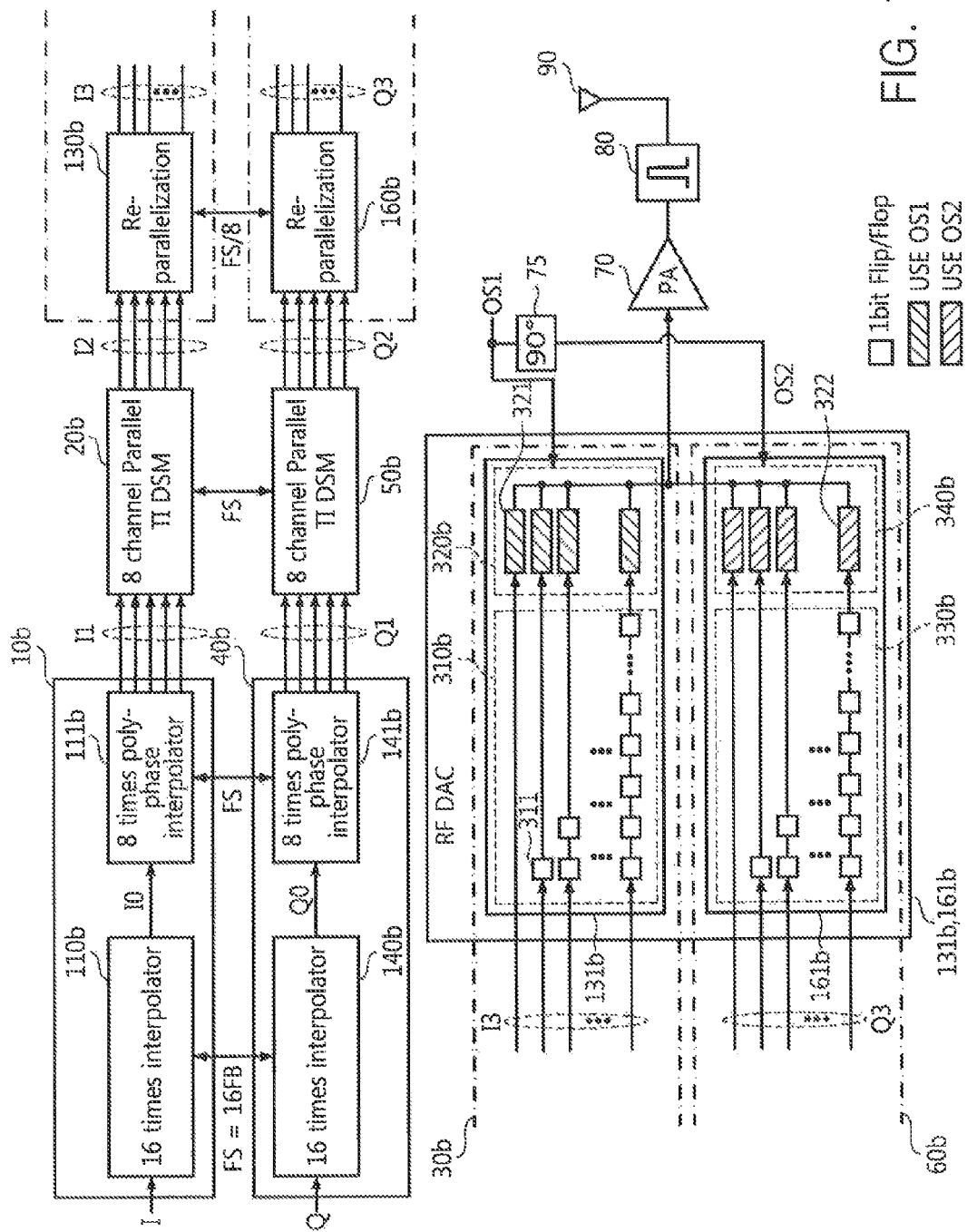
FIG. 12 is a schematic block diagram of a digital wireless transmitter according to an embodiment of the inventive concept.

FIG. 12 is a schematic block diagram of a digital wireless transmitter according to an embodiment of the inventive concept. FIGS. 13A through 13F illustrate signal spectrum at various locations in the digital wireless transmitter illustrated in FIG. 12. It is assumed that N is 8 in the embodiment illustrated in FIG. 12.

The digital wireless transmitter illustrated in FIG. 12 is a quadrature transmitter that transmits a quadrature signal including an in-phase signal and a quadrature-phase signal. The digital wireless transmitter may include first and second serial-to-parallel converters 10b and 40b, first and second N-channel parallel DSM modules 20b and 50b, first and second RF converters 30b and 60b, a phase converter 75, a power amplifier 70, a band pass filter 80, and an antenna 90.

Since the structure and functions of the digital wireless transmitter illustrated in FIG. 12 are similar to those of the digital wireless transmitter 1A illustrated in FIG. 3, differences therebetween will be mainly described. It is assumed that L is 16, M is 8, and N is 8 in the embodiment illustrated in FIG. 12.

The first serial-to-parallel converter 10b may include first and second interpolators 110b and 111b. The first interpolator 110b may perform an L (i.e., 16)-time interpolation to a serial digital input signal I and output a serial signal I0. The second interpolator 111b may perform an interpolation M (i.e., 8)-time interpolation to the L-time interpolated signal and output N (i.e., 8) parallel signals I1. The second interpolator 111b may be implemented using a poly-phase interpolator.

The digital input signals I and Q that input to the first and second serial-to-parallel converters 10b and 40b, respectively may be a 64-ary quadrature amplitude modulation (64-QAM) orthogonal frequency division multiplexing (OFDM) signal. For example, a bandwidth of the digital input signals I and Q may be about 20 MHz, as shown in FIG. 13A. However, the digital input signals I and Q are not restricted to this example.

When a frequency of the digital input signal I that is input to the first interpolator 110b is the baseband frequency FB, the first interpolator 110b may operate at an operating frequency FS (i.e., FS=L*FB). Since L is assumed to be 16 in this example, the operating frequency FS may be a 16*FB. When M is the same as N, the second interpolator 111b may also operate at the operating frequency of L*FB.

Figure 13B:
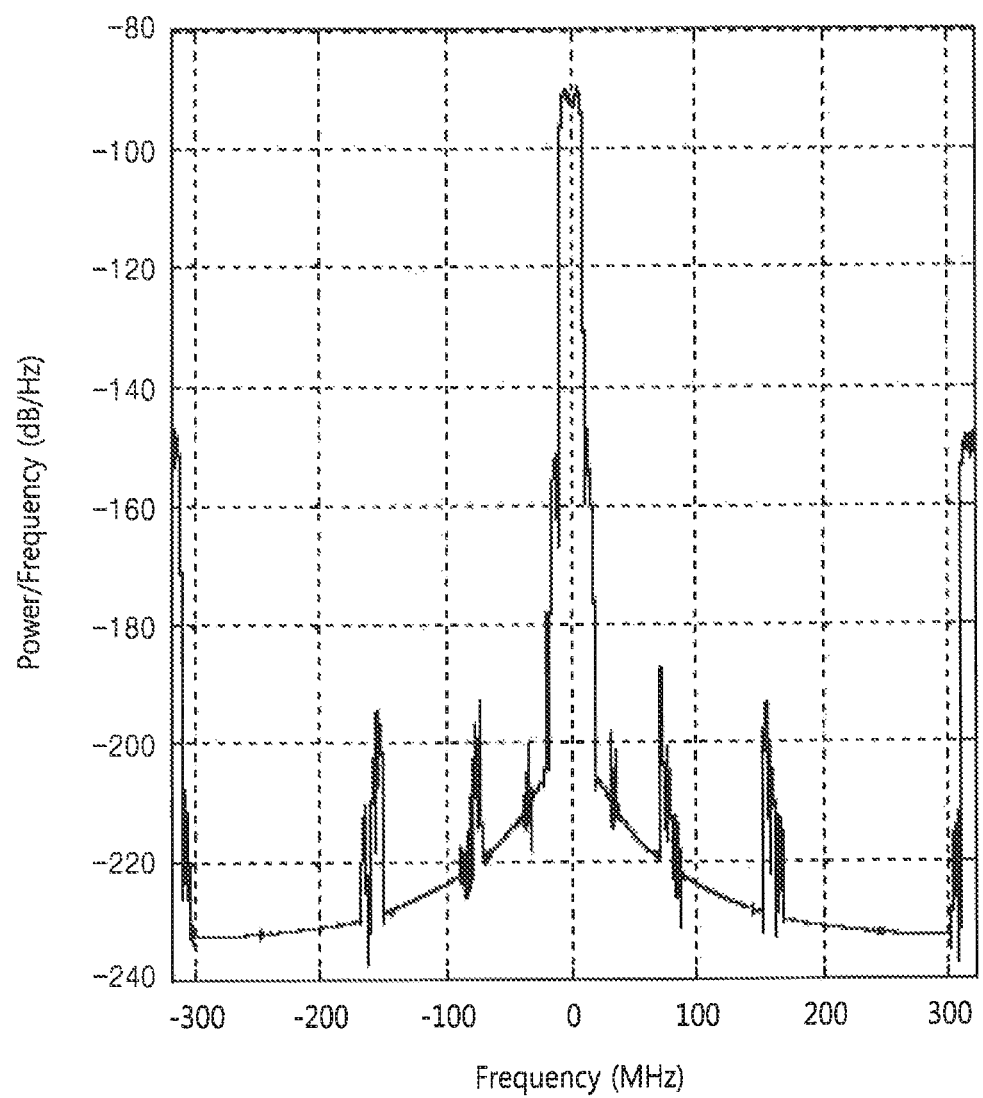

The signal I0 output from the first interpolator 110b may be a L (i.e., 16) times interpolated signal of the digital input signal I, and have a spectrum in frequency domain as shown in FIG. 13B, and input to the second interpolator 111b. Each of the eight parallel signals I1 output from the second interpolator 111b may be a 128 times interpolated signal of the digital input signal I. The parallel signals I1 may have a spectrum in frequency domain as shown in FIG. 13C.

Figure 13D:
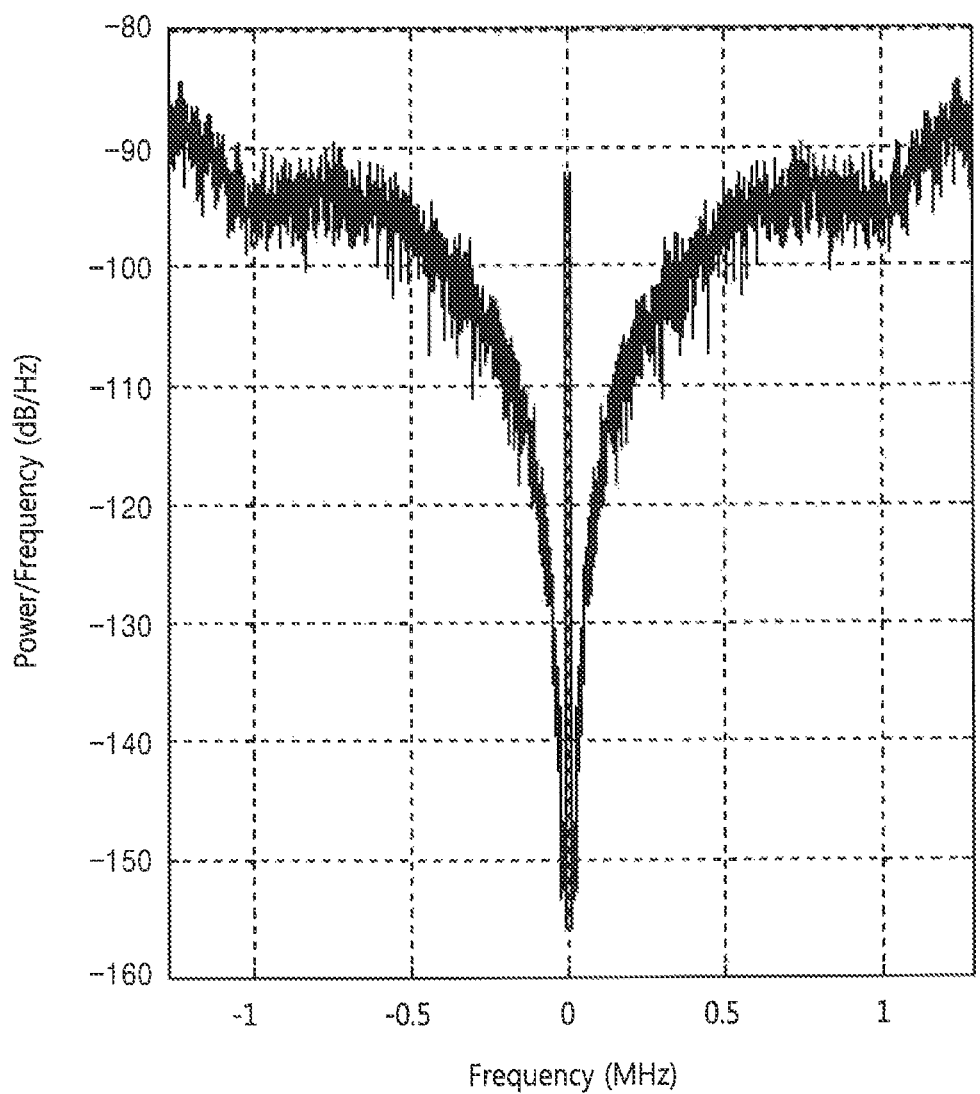

The first N-channel parallel DSM module 20b may receive and perform delta-sigma modulation on the N parallel signals I1 and may be implemented in a similar manner to the first N-channel parallel DSM module 20a. The output signals I2 of the first N-channel parallel DSM module 20b may have a spectrum in frequency domain as shown in FIG. 13D.

The output signals I2 of the first N-channel parallel DSM module 20b may be input to the first re-parallelization module 130b. The first re-parallelization module 130b may re-parallelize the N parallel DSM signals I2 output from the first N-channel parallel DSM module 20b into K (e.g., 64) parallel DSM signals and output first through K-th re-parallelized signals I3, where K is a positive integer greater than N.

The structures and operations of the second serial-to-parallel converter 40b, the second N-channel parallel DSM module 50b, and the second re-parallelization module 160b in a path that receives and processes the quadrature-phase digital input signal Q are substantially the same as those of the first serial-to-parallel converter 10b, the first N-channel parallel DSM module 20b, and the first re-parallelization module 130b, respectively. Thus, detailed descriptions of similar features will be omitted.

First and second RF DACs 131b and 161b may include first and second delay modules 310b and 330b, respectively, and first and second RF converter modules 320b and 340b, respectively. The first RF DAC 131b including the first delay module 310b and the first RF converter module 320b may process an in-phase signal output from the first re-parallelization module 130b. The second RF DAC 161b including the second delay module 330b and the second RF converter module 340b may process a quadrature-phase signal output from the second re-parallelization module 160b. The structure and operations of the RF DACs 131b and 161b are substantially the same as those of the RF DAC 131a, and therefore, descriptions of similar features will be omitted.

Figure 13F:
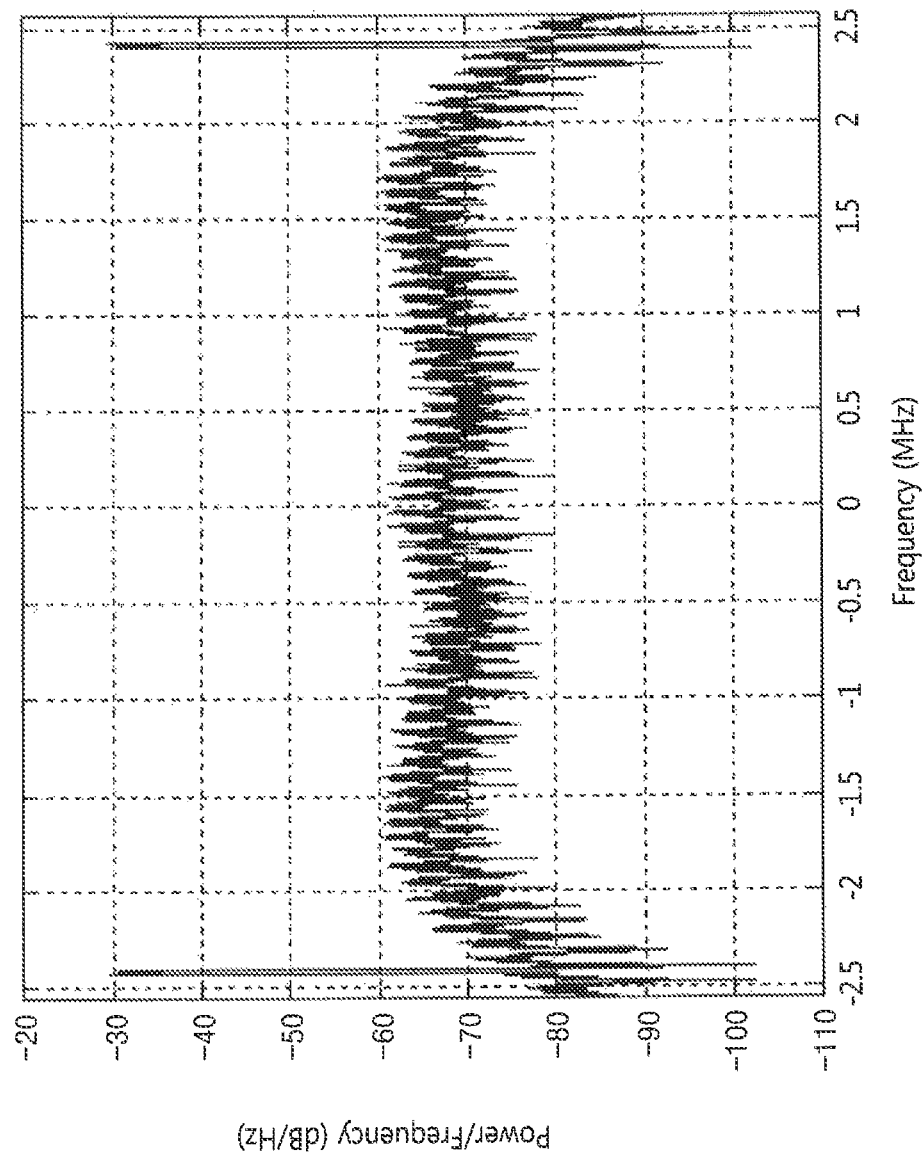

Output signals of the delay modules 310b and 330b may have a spectrum in frequency domain as shown in FIG. 13E. Output signals of the RF converter modules 320b and 340b may have a spectrum in frequency domain as shown in FIG. 13F.

Figure 14:
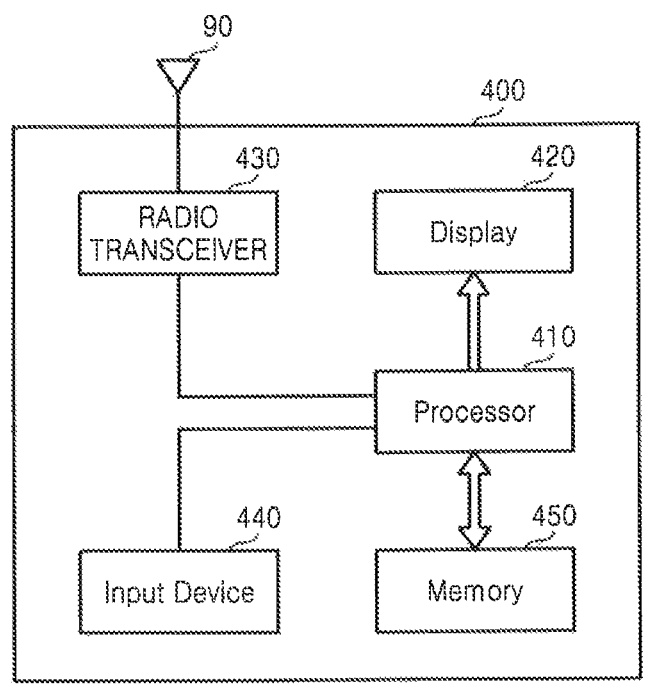
FIG. 14 is a block diagram of a wireless communication system 400 including the digital wireless transmitter according to an embodiment of the inventive concept.

FIG. 14 is a block diagram of a wireless communication system 400 including the digital wireless transmitter according to an embodiment of the inventive concept. Referring to FIG. 14, the wireless communication system 400 may be implemented using a cellular phone, a smart phone, a tablet personal computer (PC), a personal digital assistant (PDA), a radio communication system, or the like.

The wireless communication system 400 may include a processor 410, a display 420, a radio transceiver 430, an input device 440, and a memory 450.

The radio transceiver 430 transmits or receives radio signals through an antenna 90. The radio transceiver 430 may include a receiver (not shown) that receives and processes radio signals input through the antenna 90, and a transmitter (not shown) that generates radio signals to be transmitted through the antenna 90.

The transmitter of the radio transceiver 430 may be the digital wireless transmitter 1 or 1A according to an embodiment of the inventive concept.

The processor 410 may process the signals output from the radio transceiver 430 and transmit the processed signals to the memory 450 or the display 420. The radio transceiver 430 may also convert signals output from the processor 410 into radio signals and output the radio signals to an external device through the antenna 90.

The input device 440 may enable a control signal to control an operation of the processor 410 or data to be processed by the processor 410, and thus, the control signal and data may be input to the wireless communication system 400. The input device 440 may be implemented using a pointing device such as a touch pad or a computer mouse, a keypad, a keyboard, or the like.

The processor 410 may control an operation of the display 420 to display data output from the memory 450, data output from the radio transceiver 430, or data output from the input device 440. According to an embodiment, a system-on-chip (SOC) including a CPU may replace the processor 410. The SOC may further include a display controller (not shown) controlling the display 420 and a memory controller (not shown) controlling the memory 450.

As described above, an operating frequency of the digital wireless transmitter according to an embodiment of the inventive concept may be reduced, thereby facilitating an embodiment of a broadband transmitter. In addition, a DSM is may convert parallel multi-bit signals into parallel single-bit signals, thereby facilitating an embodiment of an RF converter. Further, quantization noise that occurs due to the DSM may be filtered in digital domain, thereby reducing a design complexity of the RF filter.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. A digital wireless transmitter comprising:
    a serial-to-parallel converter configured to receive and interpolate a serial digital input signal, and to output N parallel signals, wherein N is a positive integer greater than one;
    a delta-sigma modulator (DSM) configured to perform delta-sigma modulation on the N parallel signals in parallel, and to output N delta-sigma modulated signals in parallel; and
    a radio frequency (RF) converter configured to arrange the N delta-sigma modulated signals into K parallel signals, to delay the K parallel signals by different delay times from one another, and to convert the delayed signals into an RF signal, where K is a positive integer greater than N,
    wherein the DSM includes first through N-channel DSM units,
    wherein the first channel DSM unit is configured to perform a first addition of a first parallel signal of the N parallel signals and a first signal generated by the second channel DSM unit, and
    wherein the second channel DSM unit is configured to perform at least one quantization on a second signal generated based on a result of the first addition of the first parallel signal and the first signal generated by the second channel DSM unit.

2. The digital wireless transmitter of claim 1, wherein the serial-to-parallel converter comprises:
    a first interpolator configured to perform an L-time interpolation to the serial digital input signal, where L is a positive integer; and
    a second interpolator configured to perform an M-time interpolation to the L times interpolated signal and to output the N parallel signals, where M is a positive integer.

3. The digital wireless transmitter of claim 1, wherein each of the first through N-th channel DSM units is configured to perform at least one addition, at least one delay, and at least one binary quantization to a corresponding one of the N parallel signals and to output the N delta-sigma modulated signals,
    wherein each of the first through N-th channel DSM units is coupled to at least one of the other channel DSM units and uses a signal generated by the at least one of the other channel DSM units as an input in the at least one addition.

4. The digital wireless transmitter of claim 3, wherein each of the first through N-th channel DSM units outputs a stream of single-bit signals.

5. The digital wireless transmitter of claim 3, wherein each of the first through N-th channel DSM units is a second- or higher-order low pass DSM unit.

6. The digital wireless transmitter of claim 5, wherein the first channel DSM unit comprises:
    a first adder configured to add the first parallel signal of the N parallel signals and an output signal of the N-th channel DSM unit;
    a second adder configured to add an output signal of the first adder and a signal obtained by delaying an output signal of a second adder of the N-th channel DSM unit;
    a third adder configured to add an output signal of the second adder and the output signal of the N-th channel DSM unit;
    a fourth adder configured to add an output signal of the third adder and a signal obtained by delaying an output signal of a fourth adder of the N-th channel DSM unit;
    a delay unit configured to delay an output signal of the fourth adder of the first channel DSM unit; and
    a quantizer configured to quantize an output signal of the delay unit.

7. The digital wireless transmitter of claim 6, wherein the second channel DSM unit comprises:
    a first adder configured to add a second parallel signal of the N parallel signals and a signal obtained by quantizing an output signal of the fourth adder of the first channel DSM unit;
    a second adder configured to add an output signal of the first adder of the second channel DSM unit and an output signal of the second adder of the first channel DSM unit;
    a third adder configured to add an output signal of the second adder of the second channel DSM unit and the signal obtained by quantizing the output signal of the fourth adder of the first channel DSM unit;
    a fourth adder configured to add an output signal of the third adder of the second channel DSM unit and the output signal of the fourth adder of the first channel DSM unit;
    a delay unit configured to delay an output signal of the fourth adder of the second channel DSM unit; and a quantizer configured to quantize an output signal of the delay unit of the second channel DSM unit.

8. The digital wireless transmitter of claim 5, wherein the delay module comprises first through K-th delay elements and the m-th delay element among the first through K-th delay elements is configured to delay the m-th parallel signal of the K parallel signals by (m−1) clock cycles, where "m" is a positive integer of at least one and at most K, wherein the RF converter module comprises a plurality of unit Gilbert cell circuits and each of the plurality of unit Gilbert cell circuits converts an output signal of a corresponding one of the first through K-th delay elements into the RF signal.

9. The digital wireless transmitter of claim 8, wherein each of the plurality of unit Gilbert cell circuits comprises:
a first transistor having a gate connected to a first input node, a source connected to a first common source node, and a drain connected to a first output node;
a second transistor having a gate connected to a second input node, a source connected to the first common source node, and a drain connected to a second output node;
a third transistor having a gate connected to the second input node, a source connected to a second common source node, and a drain connected to the first output node;
a fourth transistor having a gate connected to the first input node, a source connected to the second common source node, and a drain connected to the second output node;
a fifth transistor connected between the first common source node and a current source, and configured to receive a positive signal of a first oscillation signal; and
a sixth transistor connected between the second common source node and the current source, and configured to receive a negative signal of the first oscillation signal,
wherein an input signal to the first and second input nodes is the output signal of the corresponding one of the first through K-th delay elements.

10. The digital wireless transmitter of claim 9, wherein the first output nodes of the respective unit Gilbert cell circuits are connected in common to a first input terminal of a power amplifier and the second output nodes of the respective unit Gilbert cell circuits are connected in common to a second input terminal of the power amplifier.

11. The digital wireless transmitter of claim 1, wherein the RF converter comprises:
a re-parallelization module configured to re-parallelize the N delta-sigma modulated signals into the K parallel signals;
a delay module configured to delay the K parallel signals by different delay times from one another; and
an RF converter module configured to convert the delayed signals output from the delay module into the RF signal.

12. A digital wireless transmitter comprising:
a first serial-to-parallel converter configured to receive and interpolate a serial in-phase digital input signal and to output N in-phase parallel signals, where N is a positive integer greater than one;
a second serial-to-parallel converter configured to interpolate a serial quadrature-phase digital input signal and to output N quadrature-phase parallel signals;
a first delta-sigma modulator (DSM) configured to perform delta-sigma modulation on the N in-phase parallel signals in parallel and to output N in-phase DSM signals in parallel;
a second DSM configured to perform delta-sigma modulation on the N quadrature-phase parallel signals in parallel and to output N quadrature-phase DSM signals in parallel;
a first digital radio frequency (RF) converter configured to convert the N in-phase DSM signals output from the first DSM into an in-phase RF signal using a first oscillation signal; and
a second digital RF converter configured to convert the N quadrature-phase DSM signals output from the second DSM into a quadrature-phase RF signal using a second oscillation signal,
wherein the first and second oscillation signals have a 90-degree phase difference from each other,
wherein the first DSM includes first through N channel DSM units,
wherein the first channel DSM unit is configured to perform a first addition of a first in-phase parallel signal of the N in-phase parallel signals and a first signal generated by the second channel DSM unit,
wherein the second channel DSM unit is configured to perform at least one quantization on a second signal generated based on a result of the first addition of the first in-phase parallel signal and the first signal generated by the second channel DSM unit.

13. The digital wireless transmitter of claim 12, wherein the first digital RF converter is configured to arrange the N in-phase DSM signals into K in-phase parallel signals, to delay the K in-phase parallel signals by different delay times from one another, and to convert the delayed signals into the in-phase RF signal using the first oscillation signal, where K is a positive integer greater than N, wherein the second digital RF converter is configured to arrange the N quadrature-phase DSM signals into K quadrature-phase parallel signals, to delay the K quadrature-phase parallel signals by different delay times, and to convert the delayed signals into the quadrature-phase RF signal using the second oscillation signal.

14. The digital wireless transmitter of claim 12, wherein output signals of the first and second digital RF converters are processed by a power amplifier and a filter, and then transmitted through an antenna.

15. The digital wireless transmitter of claim 12, wherein the first serial-to-parallel converter comprises an interpolator configured to interpolate the serial in-phase digital input signal and the second serial-to-parallel converter comprises an interpolator configured to interpolate the serial quadrature-phase digital input signal.

16. The digital wireless transmitter of claim 12,
wherein each of the first through N-th channel DSM units in the first DSM is configured to perform at least one addition, at least one delay, and at least one binary quantization to a corresponding one of the N in-phase parallel signals,
wherein each of the first through N-th channel DSM units in the first DSM uses a signal generated by at least one of the other channel DSM units in the first DSM as an input in the at least one addition to the N in-phase parallel signal,
wherein each of the first through N-th channel DSM units in the second DSM is configured to perform at least one addition, at least one delay, and at least one binary quantization to a corresponding one of the N quadrature-phase parallel signals, and
wherein each of the first through N-th channel DSM units in the second DSM uses a signal generated by at least one of the other channel DSM units in the second DSM as an input in the at least one addition to the N quadrature-phase parallel signal.

17. The digital wireless transmitter of claim 16, wherein each of the first through N-th channel DSM units of the first and second DSMs outputs a stream of single-bit signals.

18. A wireless transmitter comprising:
a serial-to-parallel converter configured to receive and convert a serial input signal into at least a first parallel signal and a second parallel signal; and
a delta-signal modulator (DSM) configured to perform delta-sigma modulation to at least the first parallel signal and the second parallel signal,
wherein the DSM includes a first channel DSM unit and a second channel DSM unit,
wherein the first channel DSM unit is configured to perform a first addition of the first parallel signal and a first signal generated by the second channel DSM unit,
wherein the second channel DSM unit is configured to perform at least one quantization on a second signal generated based on a result of the first addition of the first parallel signal and the first signal generated by the second channel DSM unit.

19. The wireless transmitter of claim 18, wherein the second channel DSM unit is configured to perform a second addition of the second parallel signal and the quantized second signal.

20. The wireless transmitter of claim 18, wherein each of the first channel DSM unit and the second channel DSM unit output a stream of single-bit signals.

* * * * *